(12) United States Patent
Schuster

(10) Patent No.: US 6,801,364 B2
(45) Date of Patent: Oct. 5, 2004

(54) PROJECTION OBJECTIVE FOR MICROLITHOGRAPHY

(75) Inventor: Karl-Heinz Schuster, Königsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 89 days.

(21) Appl. No.: 09/760,066

(22) Filed: Jan. 12, 2001

(65) Prior Publication Data

US 2002/0149855 A1 Oct. 17, 2002

Related U.S. Application Data

(63) Continuation of application No. PCT/EP99/10233, filed on Dec. 21, 1999.

(30) Foreign Application Priority Data

May 14, 1999 (DE) .......................................... 199 22 209

(51) Int. Cl.$^7$ ............................ G02B 3/00; G02B 9/62; G03B 27/54
(52) U.S. Cl. ..................... 359/649; 359/713; 359/756; 359/800; 355/53; 355/67; 356/400; 250/203.7; 250/548
(58) Field of Search ................................ 359/649–651, 359/708, 713, 754, 756, 757, 800; 355/53, 67; 356/400, 399; 250/203.7, 548

(56) References Cited

U.S. PATENT DOCUMENTS

| | | | |
|---|---|---|---|
| 4,948,238 A | * | 8/1990 | Araki et al. ................ 359/708 |
| 5,099,361 A | | 3/1992 | Yamamoto et al. ......... 359/708 |
| 5,396,367 A | | 3/1995 | Ono et al. ................... 359/687 |
| 5,469,299 A | | 11/1995 | Nagano ....................... 359/661 |
| 5,805,344 A | | 9/1998 | Sasaya et al. ............... 359/649 |
| 6,259,508 B1 | * | 7/2001 | Shigematsu .................. 355/53 |
| 2002/0008861 A1 | * | 1/2002 | Singer et al. ................. 355/53 |

FOREIGN PATENT DOCUMENTS

| | | | |
|---|---|---|---|
| DE | 196 53 983 A1 | 12/1996 | |
| DE | 198 18 444 A1 | 4/1998 | |
| DE | 199 29 701 A 1 | 5/2000 | ............ G02B/1/02 |
| EP | 0 783 137 A2 | 11/1996 | |
| EP | 0 857 985 A1 | 1/1998 | |
| EP | 0 869 382 A2 | 2/1998 | |

OTHER PUBLICATIONS

U.S. patent application 09/416,105, Filed Oct. 12, 1999, Title: Microlithographic Reduction Objective, Projection Exposure Equipment and Process, 36 pgs.
U.S. patent application 09/444,063, Filed: Nov. 19, 1999, Title: Projection Objective, 36 pgs.
French Document No. 7531231, Date Oct. 13, 1975; 9 pgs.
Patent Abstracts of Japan; Pub. No. 11097347; Pub. Date Apr. 9, 1999, Applicant: Nikon Corp.;37 pgs.
PCT document WO 00/70407, PCT/EP99/10233, Date: Dec. 21, 1999, Schuster; Title: Projection Lens for Microlithography.
International Search Report; PCT/EP99/10233; May 11, 2000; 7 pgs.

* cited by examiner

Primary Examiner—Evelyn A. Lester

(57) ABSTRACT

The invention relates to a projection lens comprising a lens assembly that has at least one first narrowing of the group of light beams. A lens with a non-spherical surface is located in front of and/or behind the first narrowing.

40 Claims, 13 Drawing Sheets

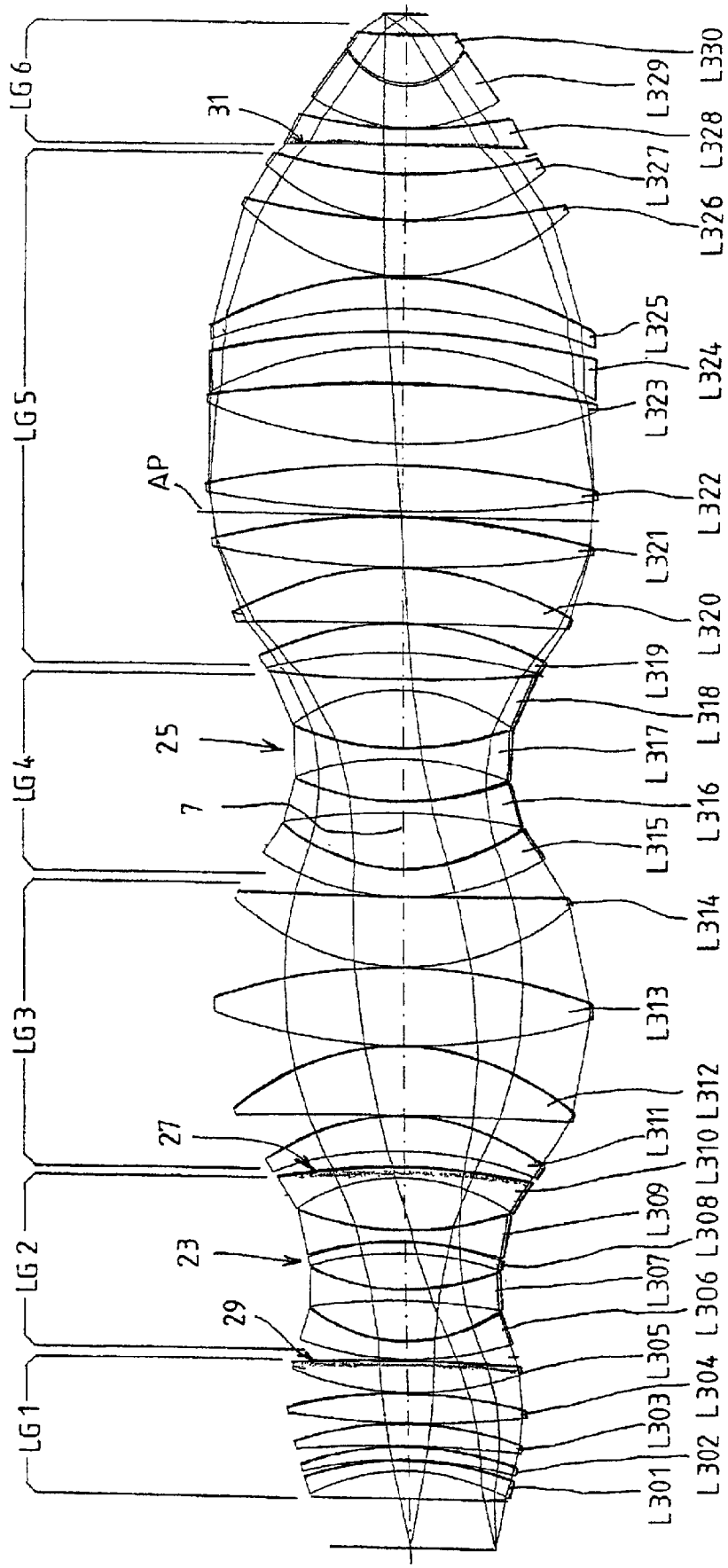

Y = -54.4
Y' = 13.6

Y = -51.0
Y' = 12.7

Y = -47.1
Y' = 11.8

PROJECTION OBJECTIVE FOR MICROLITHOGRAPHY

CROSS REFERENCE TO RELATED APPLICATIONS

This application is a continuation application of PCT/EP99/10233, filed Dec. 21, 1999 which is pending.

German Applications DE. 198 55 108A, DE 198 55 157A, and DE 198 55 158A, in which the Applicant participate are incorporated herein by reference.

STATEMENT REGARDING FEDERAL SPONSORED RESEARCH OR DEVELOPMENT

Not Applicable.

REFERENCE TO A MICROFICHE APPENDIX

Not Applicable.

BACKGROUND OF THE INVENTION

1. Technical Field

The invention relates to a projection objective with a lens arrangement, which can be divided into six lens groups. The first, third, and sixth lens groups have positive power and the second and fourth lens groups respectively have negative power. The division of the lens system into lens groups is described in more detail hereinafter, based on the direction of propagation of the radiation.

The first lens group is positive and ends with a lens of positive power. A bulge is formed by the first lens group; it is unimportant if negative lenses are also arranged in the bulge.

The second lens group is of negative total power. This second lens group has as its first lens a lens having a concave lens surface toward the image. This second lens group substantially describes a waist. Here, also it is not of substantial importance if a few positive lenses are included in the second lens group, as long as the waist is maintained The third lens group begins with a lens having positive power and a convex lens surface on the image side, and which can be a meniscus. If a thick meniscus lens is provided as the first lens, the separation of the lens groups can be considered to be within the lens.

The fourth lens group is of negative power. This fourth lens group begins with a lens of negative power, followed by several lenses having negative power A waist is formed by this lens group. It is unimportant if lenses having positive power are also contained within this lens group, as long as these influence the course of the beam over only a short distance and thus the waisted shape of the fourth lens group is maintained.

The fifth lens group has positive power overall. The first lens of this fifth lens group has a convex lens surface on the image side. A bulge is formed by the fifth lens group.

After the lens of maximum diameter (the bulge), there follow at least an additional two positive lenses in the fifth lens group, further negative lenses also being permitted.

The sixth lens group is likewise positive in its total power. The first lens of the sixth lens group is negative and has on the image side of concave lens surface. This first lens of the sixth lens group has a considerably smaller diameter in comparison with the maximum diameter of the bulge.

2. Background Art

Such projection objectives are in particular used in microlithography. They are known, for example, from the German Applications DE 198 55 108A, DE 198 55 157A, and DE 198 55 158A, in which the Applicant participated, and from the state of the art cited therein. These documents are incorporated herein by reference.

These projection objectives are usually constructed from purely spherical lenses, since the production and testing technology is advantageous for spheres.

Projection objectives are known from German Application DE 198 18 444 A1 which have lenses having aspheric surfaces in at least the fourth or fifth lens group. An increase of the numerical aperture and of the image quality can be attained by means of the aspheric surfaces. The projection objectives shown have a length from the mask plane to the image plane of 1,200 mm to 1,500 mm. A considerable use of material is associated with this length. High production costs are entailed by this use of material, since because of the required high image quality only high quality materials can be used. Aspheric lenses up to a diameter of about 300-mm are required, the provision of which is particularly expensive. It is not at all clear in the technical world whether aspheric lenses with such large lens diameters can be provided in the required quality. "Aspheric surfaces" are understood to include all surfaces which are not spherical and which are rotationally symmetrical. Rotationally symmetrical splines can also be considered as aspheric lens surfaces.

SUMMARY OF THE INVENTION

The invention has as its object to provide a projection objective which has as few lenses as possible, with reduced use of material, the aspheric lens surfaces used being as few and as small as possible, with the lowest possible asphericity. A high aperture projection objective of short structure is to be cost-efficiently provided in this way.

The object of the invention is attained in particular by a projection objective for microlithography having a lens arrangement comprising a first lens group having positive power; a second lens group having negative power; a third lens group having positive power; a fourth lens group having negative power; a fifth lens group having positive power; and a sixth lens group having positive power; wherein a lens at the end of the second lens group, particularly the last lens of the second lens group, or a lens at the beginning of the third lens group, particularly the first lens of the third lens group, has an aspheric surface. In addition, the object of the invention is attained by a projection objective having a lens arrangement having at least a first waist of a pencil of rays, wherein the lens arrangement comprises at least one of the following a lens having an aspheric surface arranged before the first waist, a lens having an aspheric surface arranged after the first waist, and lenses having aspheric surfaces arranged before and after the first waist.

In a projection objective with a lens arrangement, by the measure of providing, in the forward half of this lens arrangement, at least one lens provided with an aspheric lens surface, the possibility was realized of furnishing a projection objective of compact construction and having a high image quality.

In the division of this lens arrangement into six lens groups: a first lens group having a positive power, a second lens group a negative power, a third lens group a positive power, a fourth lens group a negative power, and a fifth and sixth lens group respectively a positive power, a preferred position of the aspheric surface is at the end of the second lens group. It is then arranged, in particular, on the last lens of the second lens group or at the beginning of the third lens group, and indeed preferably on the first lens of the third lens group. A correction of image errors in the region between the image field zone and the image field edge is possible by means of this aspheric lens surface. In particular, the image errors of higher order, which become evident on considering sagittal sections, can be corrected. Since these image errors apparent in sagittal section are particularly difficult to correct, this is a particularly valuable contribution. In an advantageous embodiment, only one lens has an aspheric surface. This has a positive effect on the production costs, since it is the production of highly accurate aspheric surfaces that requires considerable technological effort, which entails increased costs. It was only with the use of exactly one aspheric lens that it was possible to provide a very compact objective, in which case the additional costs for the aspheric lens are not important, since considerable cost savings were connected with the reduction of the required material and of the surfaces to be processed and tested.

By the measure of providing lens arrangement that bas at least a first waist, an aspheric surface before and an aspheric surface after the waist, a lens arrangement is produced which makes possible a high numerical aperture with high image quality, particularly for the DUV region. In particular, it is possible by the use of these aspheric surfaces to furnish a projection objective of short structure and high image quality. Objectives used in microlithography generally have a high material density over their whole length, so that the reduction of the length is connected with a considerable saving of material. Since only very high-grade materials can be used for projection objectives, particularly for microlithography, the required use of material has a severe effect on the production costs.

The aspheric surface arranged before the first waist can be arranged at the end of the first lens group or at the beginning of the second lens group. Furthermore, it has been found to be advantageous to arrange an aspheric surface, arranged after the first waist, on the last lens of the second lens group or on the first lens of the third lens group.

The aspheric surface provided before the first waist in particular makes possible a targeted correction of coma in the region of the image field zone. This aspheric lens surface has only a slight effect on the skew spherical aberration in tangential section and in sagittal section. In contrast to this, the skew sagittal aberration, particularly in the region between the image field zone and image field edge, can be corrected by the aspheric lens surface after the waist.

The provision of a second aspheric lens surface is thus a worthwhile measure, in order to counter at high numerical aperture a reduction of image quality due to coma In a few cases of application, particularly with very high numerical aperture, it has been found to be favorable to provide a projection objective wherein the third lens group has a lens having an aspheric surface, and, in particular, the last lens of the third lens group has an aspheric surface.

It has been found to be advantageous to provide a first lens in the sixth lens group with an aspheric surface for a further correction of coma, especially in the region of the image filed edge. For this aspheric lens surface the first lens of the sixth lens group has been found to be a particularly well suited position.

Furthermore, the numerical aperture can be increased, at constant image quality, by the provision of a further aspheric surface on the last lens of the third lens group.

It is an advantage of the invention to provide a refractive microlithographic projection objective, wherein all aspheric lens surfaces have a vertex radius (R) of at least 300-mm. Thus the aspheric surfaces are provided on long radii, since the production and testing is easier for lens surfaces with long radii. These surfaces are easily accessible to processing equipment because of their low curvature. In particular, surfaces with long radii are accessible with Cartesian coordinates for tactile measurement processes.

It bas been found to be advantageous to use at least two different materials for achromatization, for projection objectives designed for an illumination wavelength of less than 200 nm, because of the stronger dispersion of the lenses, even with the use of narrow-band light sources. In particular, fluorides, especially $CaF_2$, are known as suitable materials, besides quartz glass.

It has been found to be advantageous to provide at least two leases of $CaF_2$, which are arranged before an aperture stop in the fifth lens group, for the correction of color transverse errors.

It has been found to be advantageous for the fourth correction of color errors to integrate an achromat after the aperture stop by means of a positive $CaF_2$ lens and a following negative quartz lens. This arrangement has a favorable effect on the correction of the spherical portions. In particular, longitudinal color errors can be corrected by the lenses after the aperture stop.

A reduction of the longitudinal error already results in general from the shortening of the length of the projection objective. Thus a good achromatization with a reduced use of $CaF_2$ lenses can be attained with the objective according to the invention.

BRIEF DESCRIPTION OF THE DRAWINGS

The invention is described in more detail hereinafter with the aid of preferred embodiments, in which:

FIG. 4 shows a lens section through a third lens arrangement, which has three aspheric lens surfaces;

DETAILED DESCRIPTION OF PREFERRED EMBODIMENTS

Figure 1:
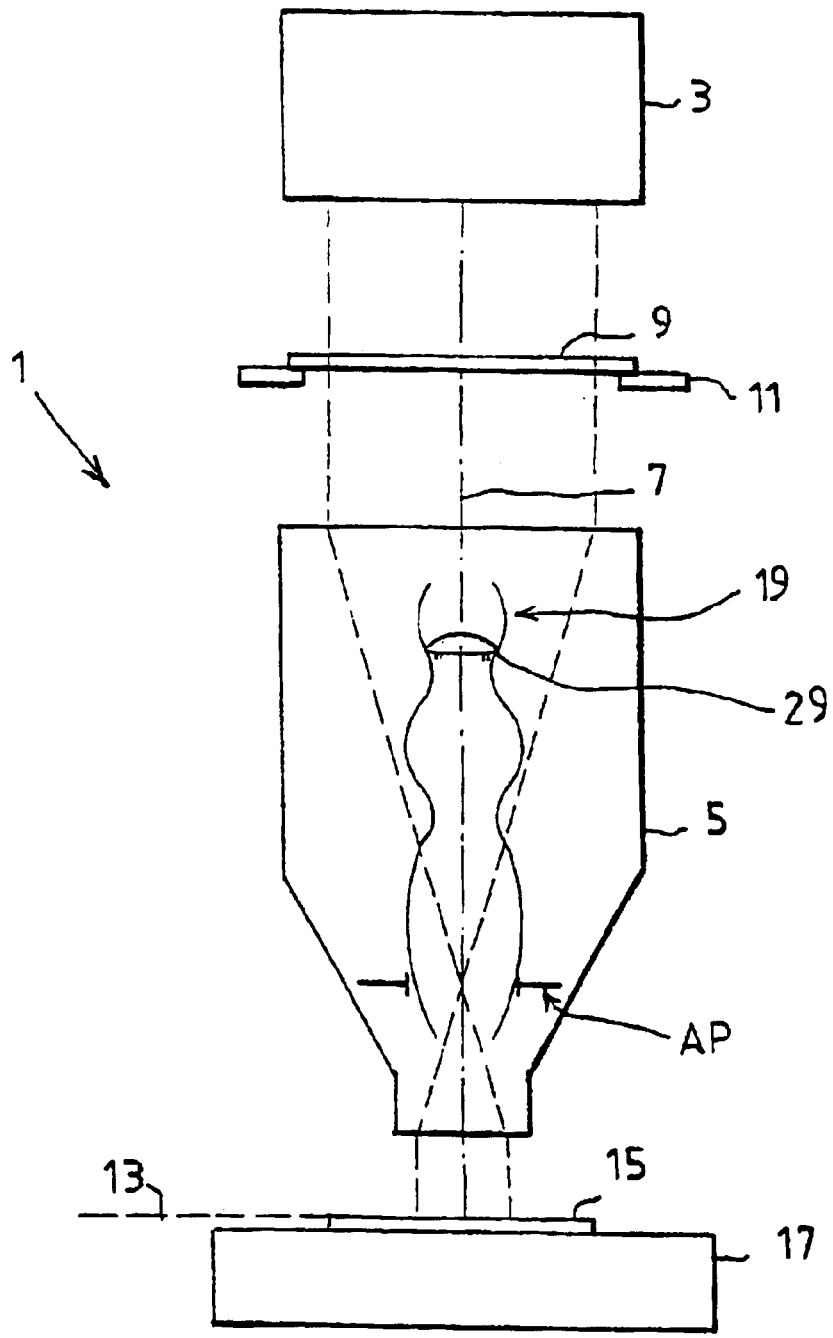
FIG. 1 shows a schematic illustration of a projection exposure device.

The principle of the construction of a projection exposure device is first described with the aid of FIG. 1. The projection exposure device 1 has an illuminating device 3 and a projection objective 5. The projection objective includes a lens arrangement 19 with an aperture stop AP, an optical axis 7 being defined by the lens arrangement 19. A mask 9 is arranged between the illuminating device 3 and the projection objective 5 and is supported in the beam path by means of a mask holder 11. Such masks 9 used in microlithography have a micrometer to nanometer structure in which is reduced by means of the projection objective 5 by a factor of up to 10, particularly a factor of four, and is imaged on an image plane 13. A substrate positioned by a substrate holder 17 or a wafer 15 is supported in the image plane 13. The minimum structures which are still resolvable depend on the wavelength λ of the light used for illumination, and also on the numerical aperture of the projection objective 5, the maximum attainable resolution of the projection exposure device 1 increasing with decreasing wavelength of the illuminating device 3 and with increasing numerical aperture of the projection objective 5.

The projection objective 5 contains, according to the invention, at least one aspheric surface to provide a high resolution.

Various embodiments of lens arrangements 19 are shown in FIGS. 2–4 and 8–10.

These projection objectives 5 designed for more stringent requirements for image quality and for resolution, and in particular their lens arrangement 19, are described in more detail hereinafter. The data of the individual lenses L101–130, L201–230, L301–330, L401–429, L501–529, L601–629, can be found in detail in the associated tables. All the lens arrangements 19 have at least one aspheric lens surface 27.

These aspheric surfaces are described by the equation:

$$P(h) = \frac{\delta \cdot h \cdot h}{1 + \sqrt{1 - (1 - EX) \cdot \delta \cdot \delta \cdot h \cdot h}} + C_1 h^4 + \ldots + C_n h^{2n+2} \quad \delta = 1/R$$

in which P is the arrow height as a function of the radius h (height to the optical axis 7) with the aspheric constants $C_1$ through $C_n$ given in the Tables. R is the vertex angle given in the Tables.

Figure 2:
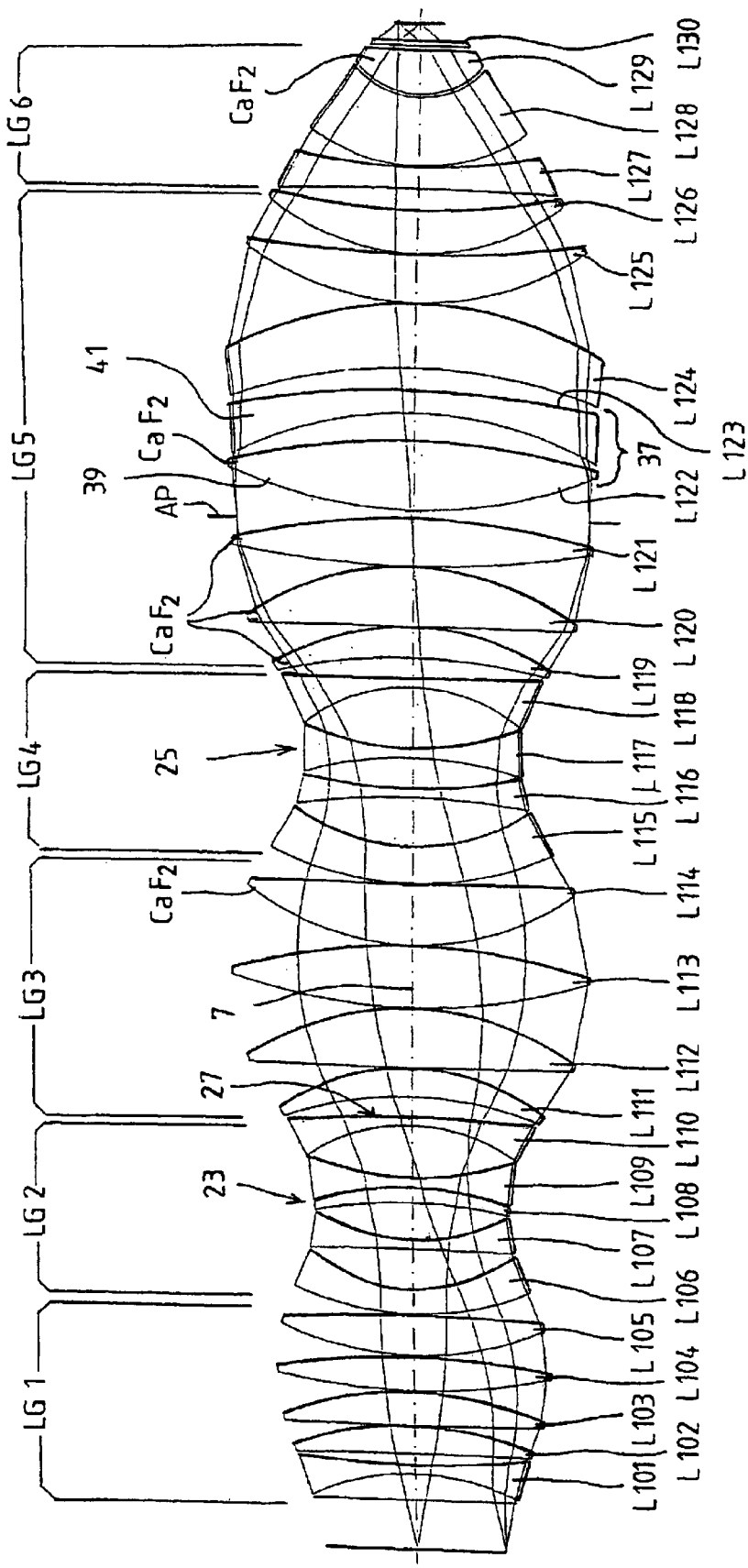
FIG. 2 shows a lens section through a first lens arrangement of a projection objective with an aspheric lens surface.

The lens arrangement 19 shown in FIG. 2 has 29 lenses L101–L129 and a plane parallel plate L-130. This lens arrangement 19 can be divided into six lens groups, which are denoted by LG1 for the first lens group through LG6 for the sixth lens group. The first, fifth and sixth lens groups have positive refractive power, while the second lens group LG2 and the fourth lens group LG4, by which a first waist 23 and a second waist 25 are formed, have negative refractive power. This lens arrangement 19 is designed for the wavelength λ=193.3 nm which is produced by a KrF excimer laser, and has an aspheric lens surface 27. A structure width of 0.10 μm is resolvable with this lens arrangement 19 at a numerical aperture of 0.75. On the object side, the light transmitted by the lens arrangement propagates in the form of a spherical wavefront. In the objective, the greatest deviation from the ideal wavefront, also denoted by the RMS factor, is 10.4 mλ with respect to the wavelength λ=193.3 nm. The image field diagonal is 28 mm. The constructional length from mask plane to object plane is only 1,000 mm, and the maximum diameter of a lens is 235 mm.

In this embodiment, this aspheric lens surface 27 is arranged on the side of the lens L110 remote from the illumination device.

The projection objective having the previously mentioned good performance data could for the first time be furnished with the use of this aspheric lens surface 27. This aspheric lens surface 27 serves to correct image and reduce the required constructional length, with image quality remaining constant. In particular, image errors of higher order in the region between the image zone and image field edge are corrected here by this aspheric surface 27. This correction brings about, in particular, an increase in the image quality in the sagittal direction The dispersion of the available lens materials increases with shorter wavelengths. Consequently, increased chromatic image errors arise in projection objectives for short wavelengths such as 193 nm or 157 nm. The usual embodiment for 193 nm therefore has quartz glass as the flint and $CaF_2$ as the crown, as lens materials for achromatization.

With an overall minimum use of the problematic $CaF_2$, care has to be taken in that a $CaF_2$ lens L114 in the third lens group LG3 places an increased requirement on the homogeneity of the material, since it is arranged far from the aperture stop AP. For this purpose, however, it has a moderate diameter, which substantially improves the availability of $CaF_2$ with an increased requirement.

For the correction of color transverse error, three $CaF_2$ lenses L119, L120, L121 are arranged in the fifth lens group LG5, before the aperture stop AP. An achromat 37, consisting of a convex $CaF_2$ lens L122 and a following meniscus lens L123 of quartz glass are arranged directly behind the aperture stop AP. These $CaF_2$ lenses can be of lower quality than the $CaF_2$ lens L114, since quality deviations in the middle region can easily be simultaneously corrected for all image field regions (by lens rotation during adjustment).

A further $CaF_2$ lens L129 is arranged in the sixth lens group. It is possible by means of this lens of $CaF_2$ to reduce the effects of lens heating and refractive index changes due to irradiation, named compaction.

The individual data for the lenses L101–L130 can be found in Table 1. The optically utilized diameter of all the $CaF_2$ lenses is less than 235 mm. Since the availability of $CaF_2$ is furthermore limited in dependence on the diameter required, the required diameter of the $CaF_2$ lenses used is of central importance.

Figure 3:
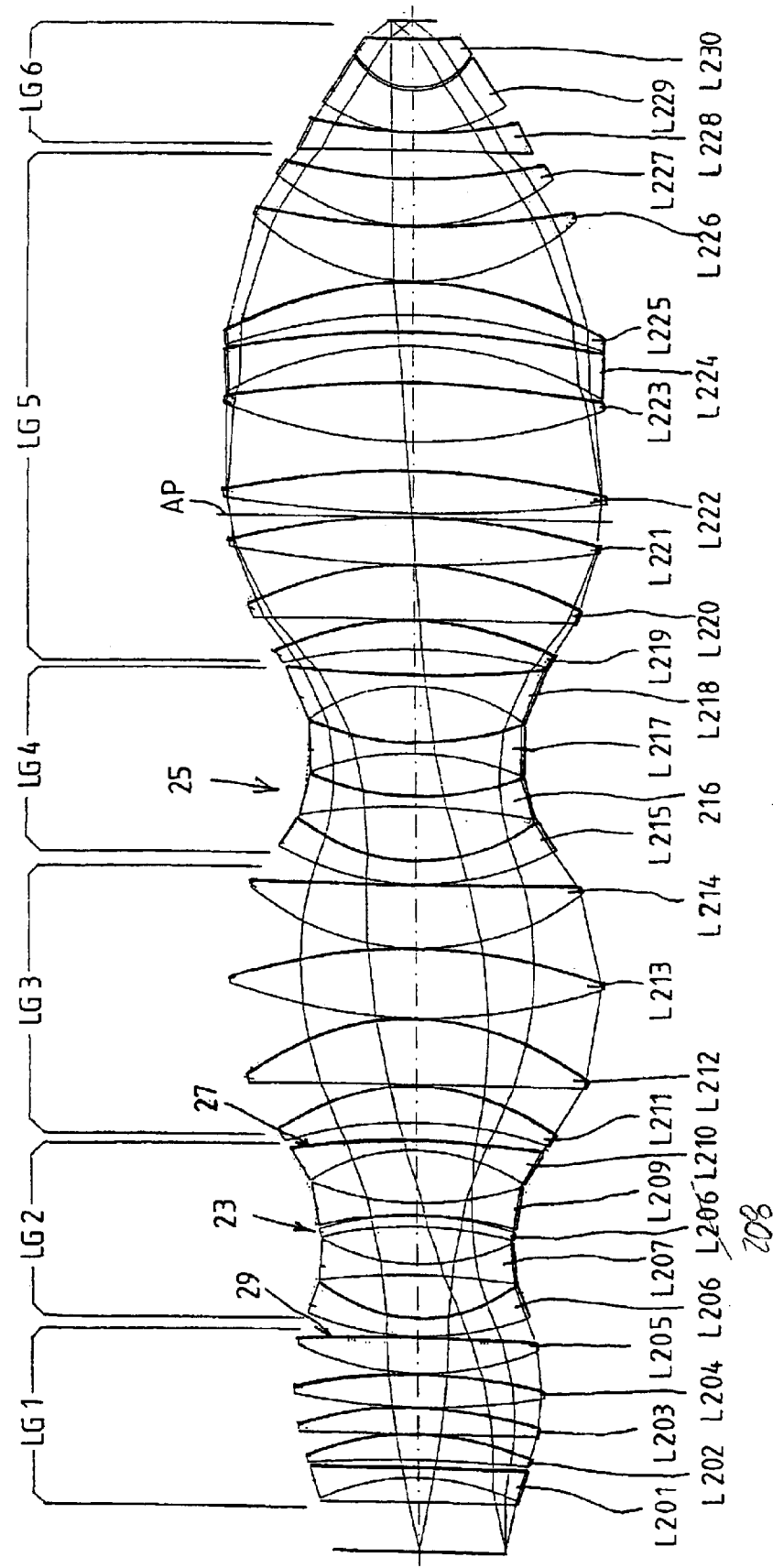
FIG. 3 shows a lens section through a second lens arrangement, which has two aspheric lens surfaces.
Figure 5A:
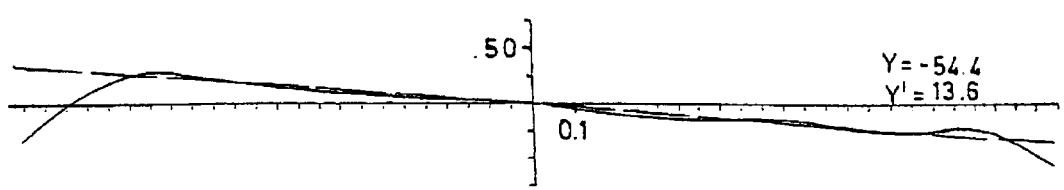
FIGS. 5a–5g illustrate tangential transverse aberrations.
Figure 5B:
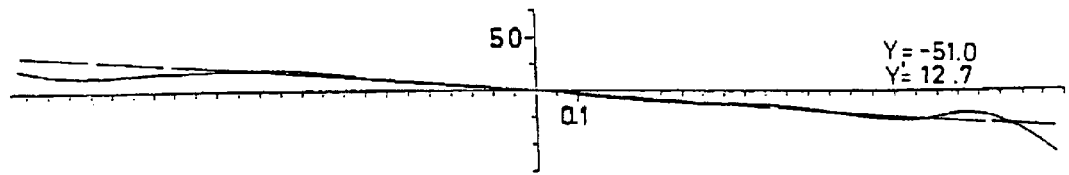
Figure 5C:
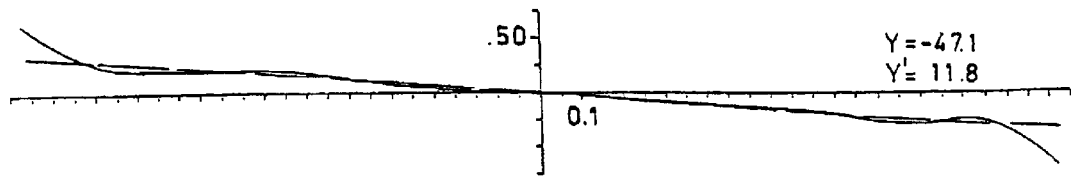
Figure 5D:
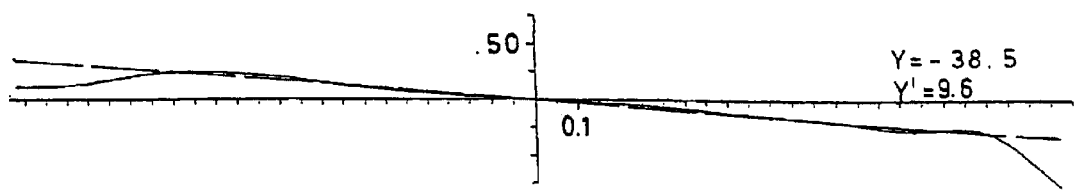
Figure 5E:
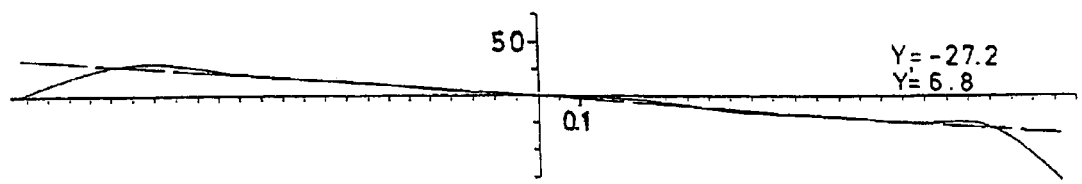
Figure 5F:
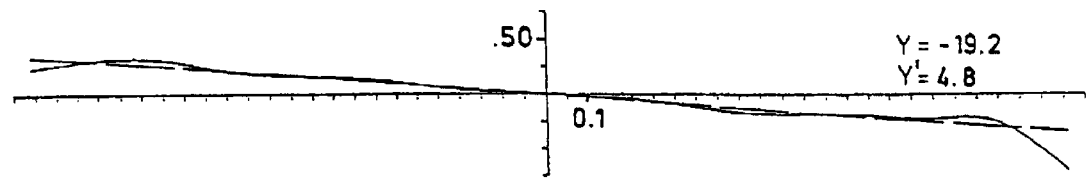
Figure 5G:
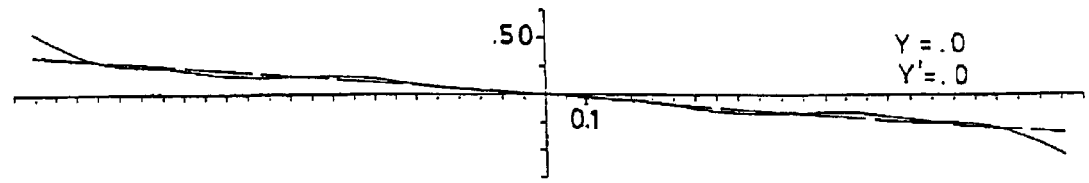
Figure 6A:
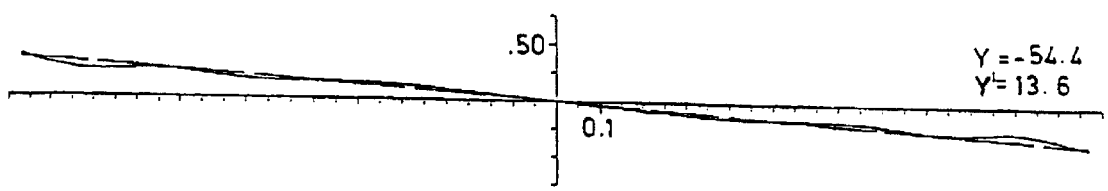
FIGS. 6a–6g illustrate sagittal transverse aberrations.
Figure 6B:
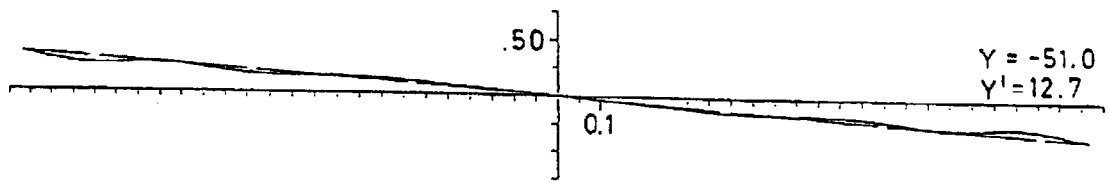
Figure 6C:
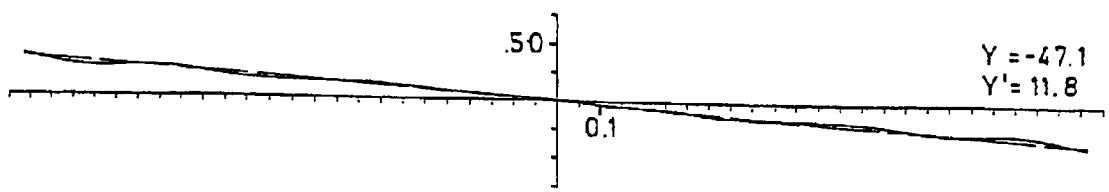
Figure 6D:
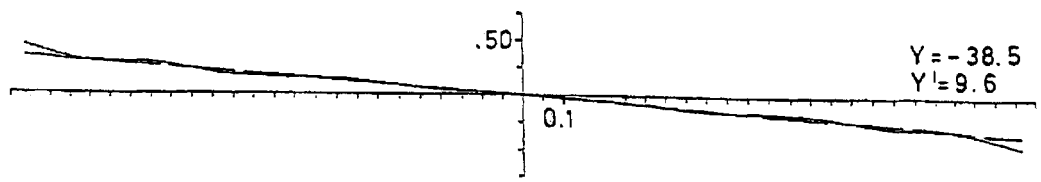
Figure 6E:
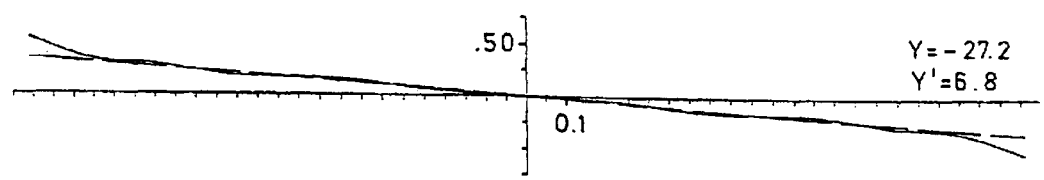
Figure 6F:
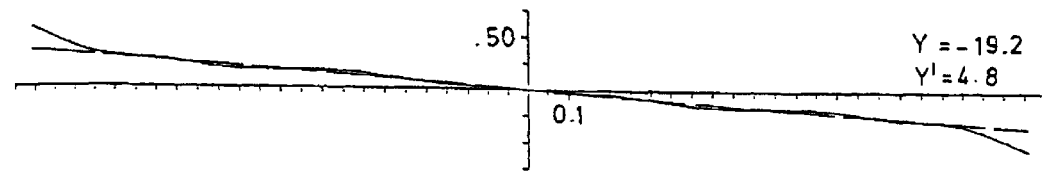
Figure 6G:
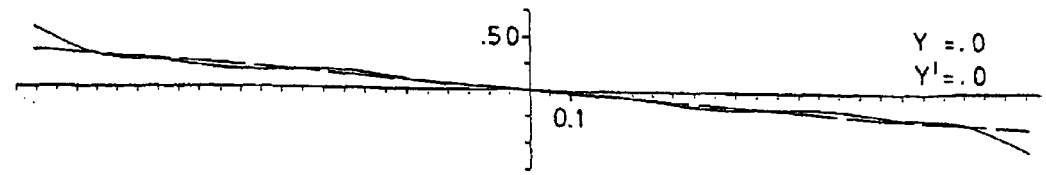
Figure 7A:
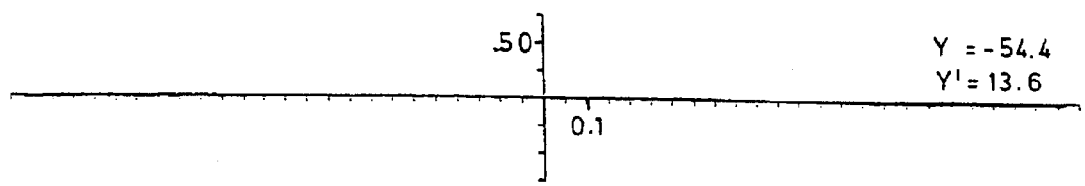
FIGS. 7a–7f illustrate groove errors of the third lens arrangement with the aid of sections.
Figure 7B:
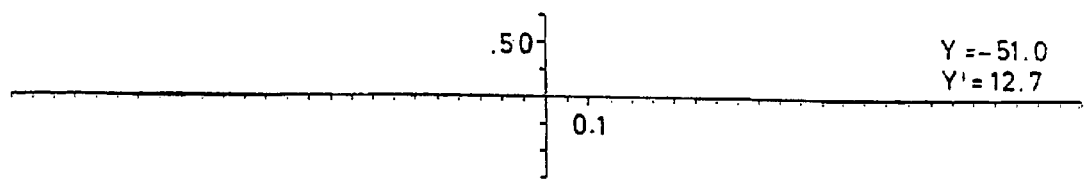
Figure 7C:
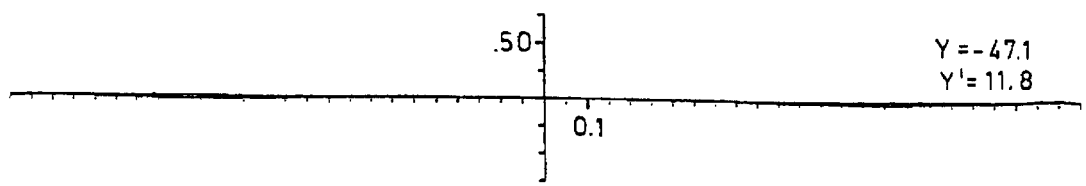
Figure 7D:
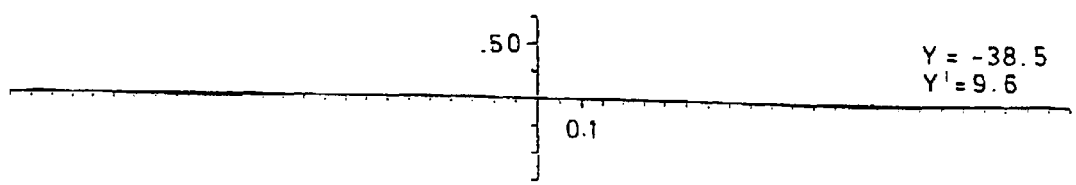
Figure 7E:
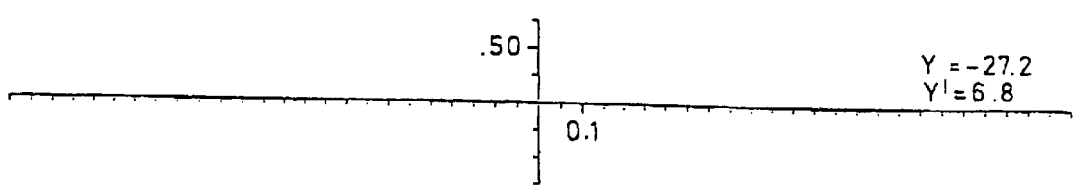
Figure 7F:
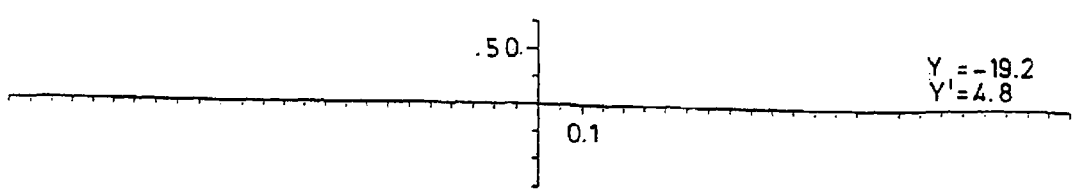

A lens arrangement 19 designed for the wavelength λ=248 nm is shown in section in FIG. 3. This lens arrangement 19 has two aspheric lens surfaces 27, 29. The first aspheric lens surface 27 is arranged on the image side on the lens L210. It can also be provided to arrange this second aspheric lens surface 27 on the side of the lens L211 facing toward the illumination device. The two lenses L210 and L211 are predetermined for the reception of the aspheric lens surface 27. Provision can also be made to provide a meniscus lens having an aspheric lens surface instead of the lenses L210 and L211. The second aspheric lens surface 29 is arranged in the end region of the first lens group, on the side of the lens L205 remote from the illumination device 3. It can also be provided to arrange this aspheric lens surface 29 on the lens L206 following thereafter in the beginning of the second lens group.

Figure 10:
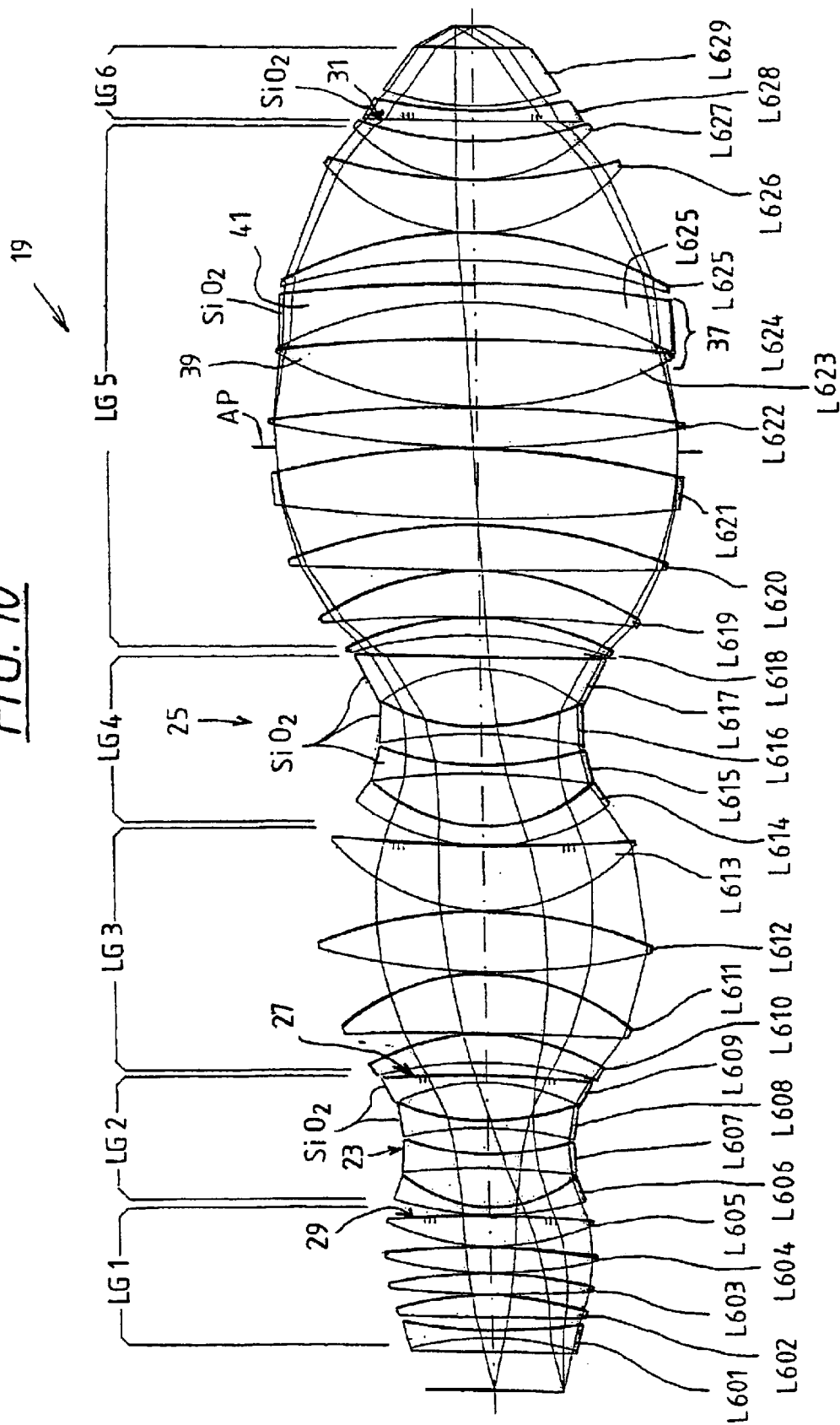
FIG. 10 shows a lens section through a sixth lens arrangement, which has four aspheric surfaces.

A particularly great effect is obtained when the aspherics 27, 29 are arranged on lens surfaces at which the incident rays include a large angle with the respective surface normals. In this case the large variation of the angle of incidence is important. In FIG. 10, the value of sin i at the aspheric lens surface 31 reaches a value of up to 0.82. Because of this, the two mutually facing lens surfaces of lenses L210, L211 in this embodiment have a greater effect on the course of the rays in comparison with the respective other lens surfaces of the corresponding lenses L210, L211.

With a length of 1,000 mm and a maximum lens diameter of 237.3 mm, this lens arrangement has a numerical aperture of 0.75 at a wavelength of 193.3 nm. The image field diagonal is 27.21 mm. A structure width of 0.15 μm is resolvable. The greatest deviation from the ideal wavefront is 13.0 mλ. The exact lens data with which these performance data were attained can be found in Table 2.

A further embodiment of a lens arrangement 19 for the wavelength 248.38 nm is shown in FIG. 4. This lens arrangement 19 has three lenses L305, L310, L328 which respectively have an aspheric lens surface 27, 29, 31. The aspheric lens surfaces 27, 29 have been left at the positions given by FIG. 3. The coma of riddle order can be adjusted for the image field zone by means of the aspheric lens surface 27. The repercussions on sections in the tangential direction and in the sagittal direction are then small.

The additional, third aspheric lens surface 31 is arranged on the mask side on the lens L328. The aspheric lens surface 31 supports coma correction toward the image field edge.

By means of these three aspheric lens surfaces 27, 29, 31, there are attained, at a wavelength of 248.38 nm and at a length of only 1,000 mm and a maximum lens diameter of 247.2 mm, the further increased numerical aperture of 0.77 and a structure width of 0.14 $\mu$m which can ba well resolved in the whole image field. The maximum deviation from the ideal wavefront is 12.0 m$\lambda$.

In order to keep the diameter of the lenses in LG5 small, and in order for a Petzval sum which, advantageously for the system, should be kept nearly zero, the three lenses L312, L313, L314 in the third lens group. LG3 are enlarged. The thicknesses, and thus the diameters, of other lenses, particularly the lenses of the first group LG1, have been reduced in order to furnish the required axial constructional space for these three lenses L312–L314. This is an excellent way to arrange very large image fields and apertures in a restricted constructional space.

The high image quality which is attained by this lens arrangement can be seen in FIGS. 5a–5g, 6a–6g and 7a–7f.

FIGS. 5a–5g give the meridional transverse aberration DYM for the image height Y' (in mm). All show an outstanding course up to the highest DW'.

FIGS. 6a–6g give the sagittal transverse aberrations DZS as a function of the half aperture angle DW' for the same image heights mm).

FIGS. 7a–7f give the groove error DYS, which is nearly zero throughout.

The exact lens data can be found in Table 3; the aspheric lens surfaces 27, 29, 31 have a consider able participation in the high image quality which can be ensured.

Figure 8:
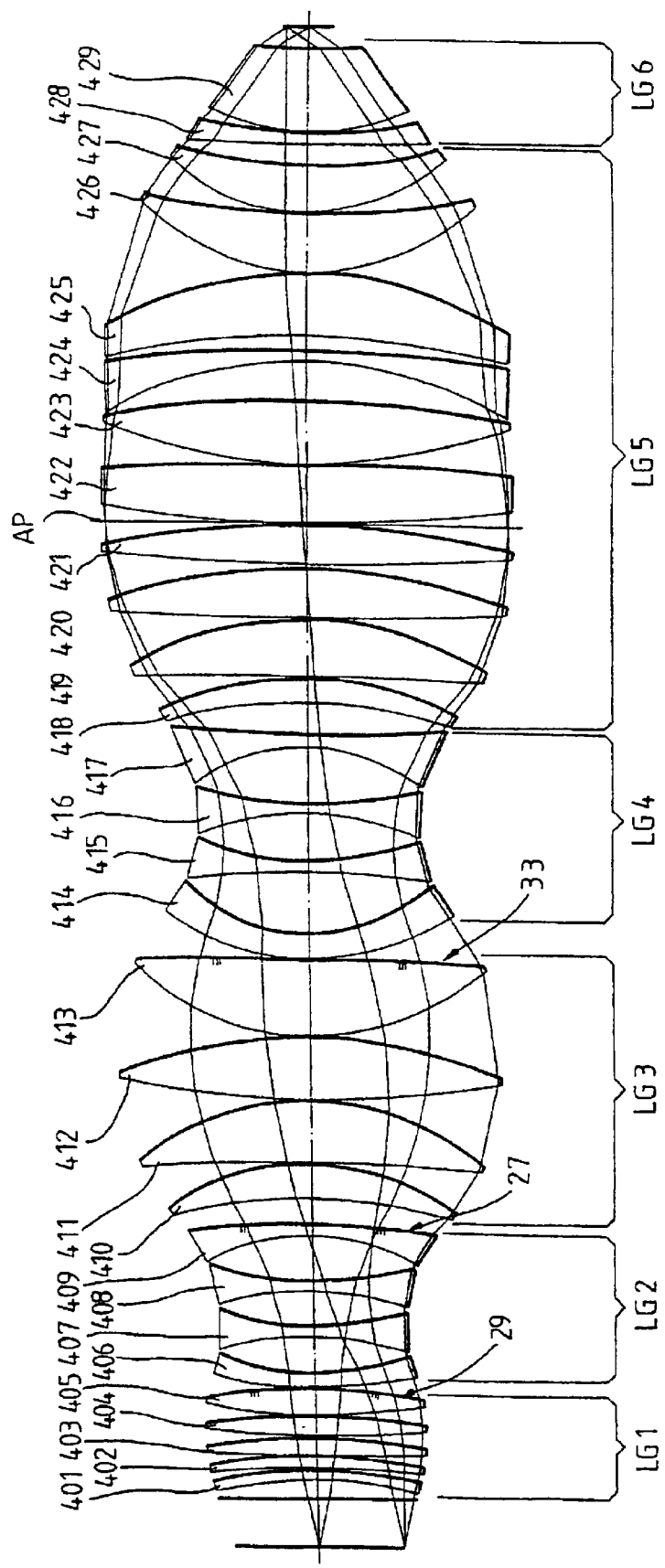
FIG. 8 shows a lens section through a fourth lens arrangement, which has three aspheric surfaces.

A further lens arrangement for the wavelength $\lambda$=248.38 nm is shown in FIG. 8. With a length of only 1,000 mm, this lens arrangement 19 has, with only three aspheric lens surfaces 27, 29, 31, a numerical aperture of 0.8; a structure width of 0.13 $\mu$M is well resolvable in the whole image field, whose diagonal is 27.21 mm. The maximum lens diameter is 255 mm and occurs in the region of the fifth lens group LG5. The lens diameter is unusually small for the numerical aperture of 0.8 at an image field having a 27.21 mm diagonal. All three aspheric lens surfaces 27,29, 31 are in the front lens groups LG1–LG3 of the lens arrangement 19. The deviation from the ideal wavefront is only 9.2 m$\lambda$ in this lens arrangement.

The exact lens data of this lens arrangement can be found in Table 4.

Figure 9:
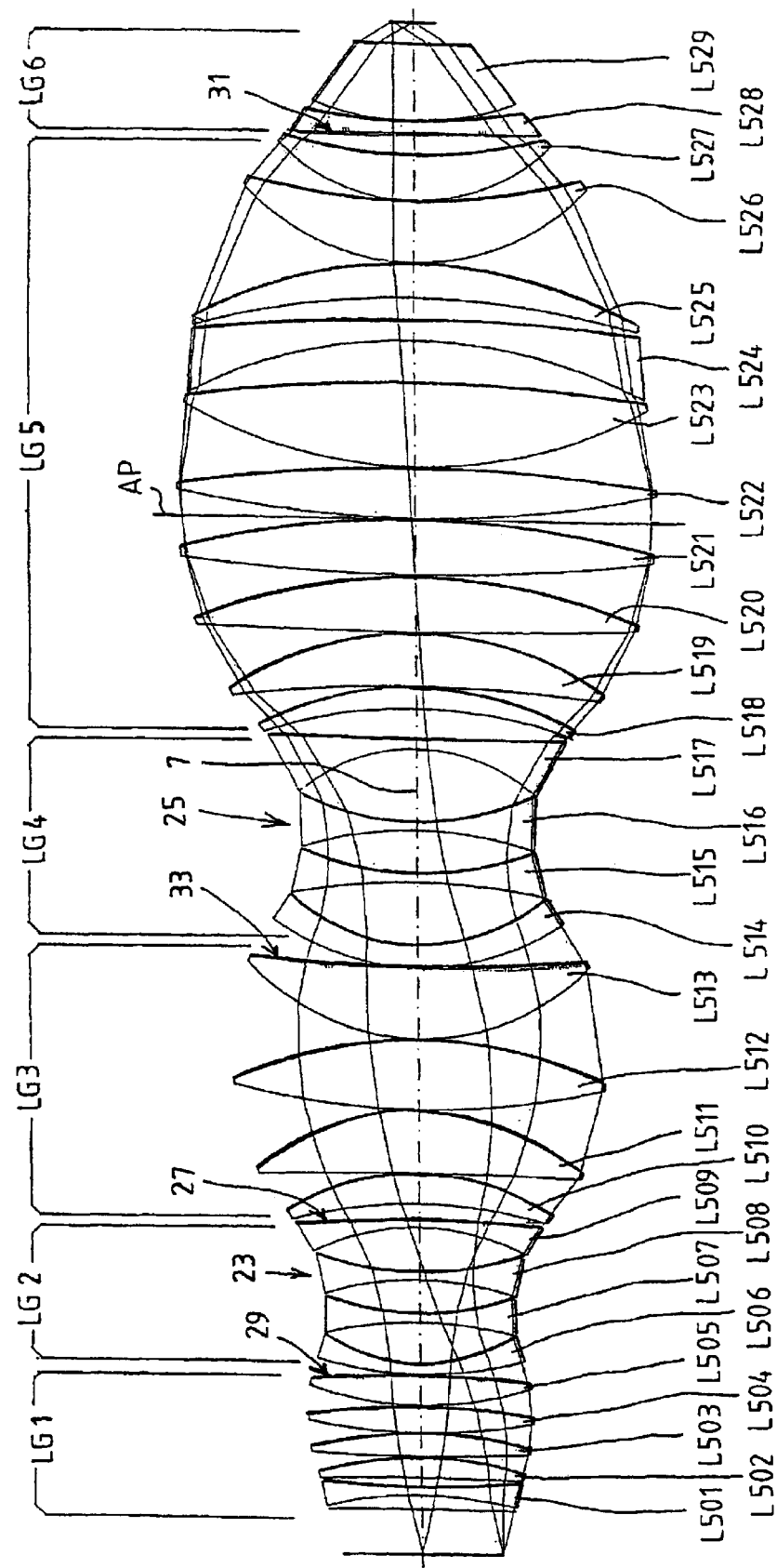
FIG. 9 shows a lens section through a fifth lens arrangement, which has four aspheric surfaces.

A further increase of the numerical aperture, from 0.8 to 0.85, could be attained by the provision of a further, fourth aspheric 33 on the side of the lens L513 remote from the illuminating device. This high numerical aperture, from which there results an acceptance angle of 116.4°, as against an angle of 88.8° with a numerical aperture of 0.70, is unparalleled for the image field with diagonal 27.21 mm. The well resolvable structure width is 0.12 $\mu$m, and the maximum deviation from the ideal wavefront is only 7.0m$\lambda$. Such a lens arrangement 19 is shown in FIG. 9, and the exact lens data can be found in Table 5.

In comparison with the preceding embodiments of FIGS. 1–3 and with the cited DE 198 18 444 A, the last two lenses are united into one lens in this lens arrangement 19. By this measure, in addition to the savings in lens production, a lens mounting can be saved in the end region, so that constructional space is created for auxiliary devices, especially for a focus sensor.

A lens arrangement 19 designed for the wavelength $\lambda$=157.63 nm is shown in FIG .10. The image field which can be illuminated with this lens arrangement has been reduced to 6×13 mm, with an image field diagonal of 14.3 mm, and is adapted for the stitching process.

With a length of only 579.5 mm and a maximum diameter of 167 mm, and with four aspheric lens surfaces 27, 29, 31,33, a numerical aperture of 0.85 and a well resolvable structure width of 0.07 $\mu$m were attained. The deviation from the ideal wavefront is 9.5 m$\lambda$ at the wavelength $\lambda$=157.63 nm.

The absorption of quartz lenses is quite high because of the short wavelength, so that recourse was increasingly had to $CaF_2$ as the lens material. Single quartz glass lenses are provided in the region of the waists 23, 25, i.e., in the second and fourth lens groups LG2 and LG4. These quartz glass lenses are to have the highest possible transmission. A further lens of quartz glass, in the form of a meniscus lens L625, is provided in the lens group LG5 to form an achromal. Furthermore in lens group LG6, the lens L628 having an aspheric lens surface is of quartz glass. The aspheric surface 33 is thus constituted of the material which is easier to process.

The color longitudinal error of this lens arrangement 19 is thus very small, even at this very high numerical aperture.

The embodiments hereinabove show that good performance data can be attained without aspheric surfaces (27, 29, 31, 33) having large diameters, especially in the fifth lens group. The small aspheric lens surfaces utilized can easily be made and tested.

These lens arrangements 19 illustrated in the embodiments show solely the design space set out by the claims. Of course, the features according to the claims and their combinations, put in concrete terms with be aid of the embodiments, can be combined with each other.

TABLE 1

| m709a Lenses | Radii | Thicknesses | Glasses | ½ × Lens Diameter |
|---|---|---|---|---|
| | infinity | 17.2886 | | 62.436 |
| L101 | −143.20731 | 6.0000 | SiO2 | 62.972 |
| | 599.77254 | 7.6370 | He | 70.369 |
| L102 | −3259.25331 | 17.8056 | SiO2 | 72.015 |
| | −215.68976 | .7500 | He | 74.027 |
| L103 | 6352.48088 | 21.0301 | SiO2 | 79.278 |
| | −222.97760 | .7500 | He | 80.492 |
| L104 | 375.05253 | 22.1160 | SiO2 | 83.813 |
| | −495.09705 | .7500 | He | 83.813 |
| L105 | 191.46102 | 26.2629 | SiO2 | 81.276 |
| | −1207.32624 | .7500 | He | 80.032 |
| L106 | 180.94629 | 15.5881 | SiO2 | 72.339 |
| | 100.48825 | 25.3787 | He | 82.801 |
| L107 | −3031.88082 | 5.000 | SiO2 | 62.147 |
| | 122.14071 | 23.8679 | He | 58.984 |
| L108 | −295.91467 | 9.3246 | SiO2 | 59.196 |
| | −187.69352 | .7500 | He | 59.874 |
| L109 | −199.96963 | 6.0000 | SiO2 | 59.882 |
| | 184.23629 | 33.9482 | He | 62.911 |
| L110 | −112.01085 | 6.0000 | SiO2 | 64.128 |
| | −684.63799A | 12.5079 | He | 75.868 |
| L111 | −225.51622 | 18.6069 | SiO2 | 78.258 |
| | −137.30628 | .7500 | He | 81.928 |
| L112 | 5312.93388 | 38.3345 | SiO2 | 99.979 |
| | −178.79712 | .7500 | He | 101.920 |

TABLE 1-continued

| Lenses | Radii | Thicknesses | Glasses | ½ × Lens Diameter |
|---|---|---|---|---|
| L113 | 344.71979 | 39.8511 | SiO2 | 111.284 |
|  | −397.29552 | .7500 | He | 111.237 |
| L114 | 166.51327 | 39.6778 | CAF2 | 101.552 |
|  | 7755.09540 | .7500 | He | 99.635 |
| L115 | 195.28524 | 23.8921 | SiO2 | 87.267 |
|  | 119.99272 | 32.2730 | He | 72.012 |
| L116 | −152.93918 | 6.0000 | SiO2 | 70.763 |
|  | 287.33119 | 20.7820 | He | 88.677 |
| L117 | −218.82578 | 6.0000 | SiO2 | 86.150 |
|  | 166.44429 | 40.5757 | He | 86.003 |
| L118 | −103.90786 | 5.4932 | SiO2 | 66.694 |
|  | 5916.68891 | 13.3336 | He | 80.535 |
| L119 | −344.93456 | 19.8584 | CAF2' | 82.790 |
|  | −165.11801 | .7500 | He | 86.174 |
| L120 | −11871.72431 | 38.5095 | CAF2 | 100.670 |
|  | −174.34079 | .7500 | He | 102.866 |
| L121 | 586.98079 | 31.6915 | CAF2 | 111.739 |
|  | −414.20537 | .7500 | He | 112.097 |
|  | infinity | 3.6849 | He | 111.399 |
|  | stop | .0000 |  | 111.399 |
|  | infinity | 1.2566 | He | 111.830 |
| L122 | 284.64742 | 45.7670 | CAF2 | 114.801 |
|  | −414.78783 | 17.9539 | He | 114.410 |
| L123 | −234.72451 | 14.5097 | SiO2 | 113.052 |
|  | −593.08647 | 14.7730 | He | 114.454 |
| L124 | −323.13587 | 42.1874 | SiO2 | 114.235 |
|  | −229.06128 | .7500 | He | 117.505 |
| L125 | 180.27184 | 31.4105 | SiO2 | 105.659 |
|  | 652.02194 | .7500 | He | 103.698 |
| L126 | 143.20049 | 28.2444 | SiO2 | 91.476 |
|  | 383.51531 | 14.7177 | He | 88.206 |
| L127 | −2122.47818 | 14.1140 | SiO2 | 85.843 |
|  | 312.60012 | 1.3119 | He | 74.815 |
| L128 | 111.82162 | 46.5147 | SiO2 | 66.708 |
|  | 53.69539 | 2.2604 | He | 40.084 |
| L129 | 51.14857 | 27.3776 | CAF2 | 39.074 |
|  | 492.53747 | 3.7815 | He | 32.621 |
|  | infinity | 3.0000 | SiO2 | 29.508 |
|  | infinity | 12.0000 |  | 27.848 |
|  | infinity |  |  | 14.021 |

Aspheric Constants:
Coefficients of the aspheric surface n: [where n is 21]

EX = 0.0000
C1 = 0.61839643 · 10$^{-4}$
C2 = 0.11347761 · 10$^{-11}$
C3 = 0.32783915 · 10$^{-16}$
C4 = 0.22000186 · 10$^{-20}$

TABLE 2

| m736a Lenses | Radii | Thicknesses | Glasses | ½ × Lens Diameter |
|---|---|---|---|---|
|  | infinity | 16.6148 |  | 60.752 |
| L201 | −140.92104 | 7.0000 | SiO2 | 61.267 |
|  | −4944.48962 | 4.5190 |  | 67.230 |
| L202 | −965.90856 | 16.4036 | SiO2 | 68.409 |
|  | −191.79393 | .7500 |  | 70.127 |
| L203 | 18376.81346 | 16.5880 | SiO2 | 73.993 |
|  | −262.28779 | .7500 |  | 74.959 |
| L204 | 417.82018 | 21.1310 | SiO2 | 77.129 |
|  | −356.78055 | .7500 |  | 77.193 |
| L205 | 185.38468 | 23.3034 | SiO2 | 74.782 |
|  | −1198.61550A | .7500 |  | 73.634 |
| L206 | 192.13950 | 11.8744 | SiO2 | 68.213 |
|  | 101.15610 | 27.6353 |  | 61.022 |
| L207 | −404.17514 | 7.0000 | SiO2 | 60.533 |
|  | 129.70591 | 24.1893 |  | 58.732 |
| L208 | −236.98146 | 7.0584 | SiO2 | 59.144 |
|  | −203.88450 | .7500 |  | 60.201 |
| L209 | −241.72595 | 7.0000 | SiO2 | 80.490 |
|  | 196.25453 | 33.3115 |  | 65.017 |
| L210 | −122.14995 | 7.0000 | SiO2 | 65.412 |
|  | −454.65265A | 10.8840 |  | 77.783 |

TABLE 2-continued

| Lenses | Radii | Thicknesses | Glasses | ½ × Lens Diameter |
|---|---|---|---|---|
| L211 | −263.01247 | 22.6024 | SiO2 | 81.685 |
|  | −149.71102 | 1.6818 |  | 85.708 |
| L212 | −23862.31899 | 43.2680 | SiO2 | 104.023 |
|  | −168.87798 | .7500 |  | 108.012 |
| L213 | 340.37670 | 44.9408 | SiO2 | 115.503 |
|  | −355.50943 | .7500 |  | 115.398 |
| L214 | 160.11879 | 41.8645 | SiO2 | 102.982 |
|  | 4450.50491 | .7500 |  | 100.763 |
| L215 | 172.51429 | 14.8161 | SiO2 | 85.869 |
|  | 116.88490 | 35.9100 |  | 74.187 |
| L216 | −395.45894 | 7.0000 | SiO2 | 72.771 |
|  | 178.01469 | 28.0010 |  | 68.083 |
| L217 | −176.03301 | 7.0000 | SiO2 | 55.613 |
|  | 188.41213 | 36.7224 |  | 66.293 |
| L218 | −112.43820 | 7.0059 | SiO2 | 66.917 |
|  | 883.42330 | 17.1440 |  | 80.240 |
| L219 | −350.01763 | 19.1589 | SiO2 | 82.329 |
|  | −194.58551 | .7514 |  | 87.159 |
| L220 | −8249.50149 | 35.3686 | SiO2 | 89.995 |
|  | −213.88820 | .7500 |  | 103.494 |
| L221 | 657.56358 | 31.3375 | SiO2 | 114.555 |
|  | −428.74102 | .0000 |  | 115.245 |
|  | infinity | 2.8420 |  | 116.016 |
|  | stop | .0000 |  | 116.016 |
| L222 | 820.30582 | 27.7457 | SiO2 | 118.196 |
|  | −520.84842 | 18.4284 |  | 118.605 |
| L223 | 330.19055 | 37.7586 | SiO2 | 118.273 |
|  | −672.92481 | 23.8692 |  | 117.550 |
| L224 | −233.67936 | 10.0000 | SiO2 | 116.625 |
|  | −538.42527 | 10.4141 |  | 117.109 |
| L225 | −340.26626 | 21.8583 | SiO2 | 116.879 |
|  | −224.85656 | .7500 |  | 117.492 |
| L226 | 146.67143 | 34.5675 | SiO2 | 100.303 |
|  | 436.70958 | .7500 |  | 97.643 |
| L227 | 135.52851 | 29.8244 | SiO2 | 85.066 |
|  | 284.57463 | 18.9234 |  | 79.427 |
| L228 | −7197.04545 | 11.8089 | SiO2 | 72.964 |
|  | 268.01973 | .7500 |  | 63.351 |
| L229 | 100.56453 | 27.8623 | SiO2 | 62.628 |
|  | 43.02551 | 2.0994 |  | 38.612 |
| L230 | 42.30652 | 30.9541 | SiO2 | 36.023 |
|  | 262.65551 | 1.9528 |  | 28.009 |
|  | infinity | 12.0000 |  | 27.482 |
|  | infinity |  |  | 13.602 |

Aspheric Constants:
Coefficients of the aspheric surface n: [where n is 29]

EX = −0.17337407 · 10$^3$
C1 = 0.15292522 · 10$^{-7}$
C2 = 0.18756271 · 10$^{-11}$
C3 = −0.40702661 · 10$^{-16}$
C4 = 0.26178919 · 10$^{-19}$
C5 = −0.36300252 · 10$^{-22}$
C6 = 0.42405765 · 10$^{-27}$

Coefficients of the aspheric surface n: [where n is 27]

EX = −0.38949981 · 10$^3$
C1 = 0.20355563 · 10$^{-7}$
C2 = −0.22884234 · 10$^{-11}$
C3 = −0.23852814 · 10$^{-16}$
C4 = −0.19091022 · 10$^{-19}$
C5 = 0.27737562 · 10$^{-23}$
C6 = −0.29709825 · 10$^{-27}$

TABLE 3

| m745a Lenses | Radii | Thicknesses | Glasses | ½ × Lens Diameter |
|---|---|---|---|---|
|  | infinity | 17.8520 |  | 60.958 |
| L301 | −131.57692 | 7.0000 | SiO2 | 61.490 |
|  | −195.66940 | .7500 |  | 64.933 |
| L302 | −254.68368 | 8.4334 | SiO2 | 65.844 |
|  | −201.64480 | .7500 |  | 67.386 |
| L303 | −775.65764 | 14.0058 | SiO2 | 69.629 |
|  | −220.44596 | .7500 |  | 70.578 |

TABLE 3-continued

| Lenses | Radii | Thicknesses | Glasses | ½ × Lens Diameter |
|---|---|---|---|---|
| L304 | 589.58638 | 18.8952 | SiO2 | 72.689 |
| | −308.25184 | .7500 | | 72.876 |
| L305 | 202.68033 | 20.7802 | SiO2 | 71.232 |
| | −1120.20883A | .7500 | | 70.282 |
| L306 | 203.03395 | 12.1137 | SiO2 | 65.974 |
| | 102.61512 | 26.3989 | | 59.566 |
| L307 | −372.05336 | 7.0000 | SiO2 | 59.203 |
| | 144.40889 | 23.3866 | | 58.326 |
| L308 | −207.93626 | 7.0303 | SiO2 | 58.790 |
| | −184.85938 | .7500 | | 69.985 |
| L309 | −201.97720 | 7.0000 | SiO2 | 60.229 |
| | 214.87718 | 33.1495 | | 65.721 |
| L310 | −121.80702 | 7.0411 | SiO2 | 67.235 |
| | −398.26353A | 9.7571 | | 79.043 |
| L311 | −242.40314 | 22.4966 | SiO2 | 81.995 |
| | −146.76339 | .7553 | | 87.352 |
| L312 | −2729.19964 | 45.3237 | SiO2 | 104.995 |
| | −158.37001 | .7762 | | 107.211 |
| L313 | 356.37642 | 52.1448 | SiO2 | 118.570 |
| | −341.95165 | 1.1921 | | 118.519 |
| L314 | 159.83842 | 44.6276 | SiO2 | 105.627 |
| | 2234.72586 | .7698 | | 102.722 |
| L315 | 172.14697 | 16.8360 | SiO2 | 88.037 |
| | 119.53455 | 36.6804 | | 75.885 |
| L316 | −382.62198 | 7.0000 | SiO2 | 74.245 |
| | 171.18767 | 29.4986 | | 67.272 |
| L317 | −178.75022 | 7.0000 | SiO2 | 68.843 |
| | 186.50720 | 36.4380 | | 67.935 |
| L318 | −113.94008 | 7.0213 | SiO2 | 68.850 |
| | 893.30270 | 17.7406 | | 82.870 |
| L319 | −327.77804 | 18.9809 | SiO2 | 85.090 |
| | −192.72640 | .7513 | | 89.918 |
| L320 | −3571.89972 | 34.3608 | SiO2 | 103.882 |
| | −209.35555 | .7500 | | 105.573 |
| L321 | 676.38083 | 32.8220 | SiO2 | 119.191 |
| | −449.16650 | .0000 | | 119.960 |
| | infinity | 2.8420 | | 120.991 |
| | stop | .0000 | | 120.991 |
| L322 | 771.53843 | 30.6490 | SiO2 | 123.568 |
| | −525.59771 | 13.4504 | | 124.005 |
| L323 | 330.53202 | 40.0766 | SiO2 | 123.477 |
| | −712.47666 | 23.6787 | | 122.707 |
| L324 | −250.00950 | 10.0000 | SiO2 | 121.877 |
| | −613.10270 | 14.8392 | | 121.995 |
| L325 | −344.62259 | 20.3738 | SiO2 | 121.081 |
| | −239.53067 | .7500 | | 121.530 |
| L326 | 146.13385 | 34.7977 | SiO2 | 102.544 |
| | 399.32557 | .7510 | | 99.992 |
| L327 | 132.97289 | 29.7786 | SiO2 | 87.899 |
| | 294.53397 | 18.8859 | | 82.024 |
| L328 | −3521.27938A | 11.4951 | SiO2 | 75.848 |
| | 287.11066 | .7814 | | 85.798 |
| L329 | 103.24804 | 27.8802 | SiO2 | 58.287 |
| | 41.64288 | 1.9089 | | 36.734 |
| L330 | 41.28081 | 31.0202 | SiO2 | 36.281 |
| | 279.03201 | 1.9528 | | 28.934 |
| | infinity | 12.0000 | | 28.382 |
| | infinity | | | 13.603 |

Aspheric Constants:
Coefficients of the aspheric surface n: [where n is 29]

EX = −0.16784083 · 10³
C1 = 0.49500479 · 10⁻⁸
C2 = 0.31354487 · 10⁻¹¹
C3 = −0.55827200 · 10⁻¹⁶
C4 = 0.44873095 · 10⁻¹⁹
C5 = −0.73057048 · 10⁻²³
C6 = 0.91524489 · 10⁻²⁷

Coefficients of the aspheric surface n: [where n is 27]

EX = −0.22247325 · 10¹
C1 = 0.24479896 · 10⁻⁷
C2 = −0.22713172 · 10⁻¹¹
C3 = 0.36324126 · 10⁻¹⁶
C4 = −0.17823989 · 10⁻¹⁹
C5 = 0.26799048 · 10⁻²³
C6 = −0.27403392 · 10⁻²⁷

TABLE 4

| m791a Lenses | Radii | Thicknesses | Glasses | ½ × Lens Diameter |
|---|---|---|---|---|
| | infinity | 11.4557 | | 61.339 |
| L401 | −273.19566 | 7.0000 | SiO2 | 62.263 |
| | −277.09708 | .7000 | | 63.765 |
| L402 | −861.38886 | 8.9922 | SiO2 | 64.989 |
| | −339.28281 | .7000 | | 65.826 |
| L403 | 118124.13719 | 11.2867 | SiO2 | 66.916 |
| | −365.70154 | .7000 | | 67.416 |
| L404 | 685.10936 | 13.1661 | SiO2 | 67.995 |
| | −485.98278 | .7000 | | 68.012 |
| L405 | 387.55973 | 17.2335 | SiO2 | 67.247 |
| | −473.09537A | .7000 | | 66.728 |
| L406 | 268.03965 | 9.9216 | SiO2 | 62.508 |
| | 149.12863 | 23.8122 | | 58.631 |
| L407 | −184.82383 | 7.0000 | SiO2 | 58.029 |
| | 176.80719 | 21.4194 | | 57.646 |
| L408 | −186.59114 | 7.0000 | SiO2 | 58.045 |
| | 218.73570 | 29.5024 | | 63.566 |
| L409 | −129.31068 | 7.0000 | SiO2 | 65.030 |
| | −531.44773A | 17.2306 | | 76.481 |
| L410 | −307.52016 | 22.4527 | SiO2 | 85.843 |
| | −148.36184 | .7000 | | 86.946 |
| L411 | −1302.18676 | 41.0518 | SiO2 | 105.065 |
| | −162.48723 | .7000 | | 107.106 |
| L412 | 621.18978 | 41.1387 | SiO2 | 118.007 |
| | −294.49119 | .7000 | | 118.347 |
| L413 | 180.08951 | 49.7378 | SiO2 | 109.803 |
| | −2770.71439A | .7000 | | 107.961 |
| L414 | 152.16529 | 16.7403 | SiO2 | 89.160 |
| | 106.43163 | 39.9369 | | 76.189 |
| L415 | −530.65958 | 7.0000 | SiO2 | 74.955 |
| | 170.83853 | 31.4993 | | 58.381 |
| L416 | −154.61084 | 7.0000 | SiO2 | 67.993 |
| | 252.85931 | 36.2904 | | 69.679 |
| L417 | −113.57141 | 8.4328 | SiO2 | 70.272 |
| | 772.56149 | 21.7682 | | 85.377 |
| L418 | −278.33295 | 16.4890 | SiO2 | 87.710 |
| | −198.24799 | .8689 | | 92.554 |
| L419 | −3464.64038 | 37.5900 | SiO2 | 107.590 |
| | −214.63481 | 1.1929 | | 111.045 |
| L420 | 2970.07848 | 32.3261 | SiO2 | 122.434 |
| | −350.93217 | 2.5303 | | 123.849 |
| L421 | 1499.34255 | 25.8285 | SiO2 | 127.128 |
| | −561.19644 | .0000 | | 127.371 |
| | infinity | .7510 | | 126.559 |
| | stop | .0000 | | 126.559 |
| L422 | 821.09016 | 39.5191 | SiO2 | 127.453 |
| | −1995.20557 | .7000 | | 127.499 |
| L423 | 337.02437 | 41.8147 | SiO2 | 126.519 |
| | −659.23025 | 25.0233 | | 125.851 |
| L424 | −242.88584 | 7.0000 | SiO2 | 124.960 |
| | −691.19390 | 9.7905 | | 125.057 |
| L425 | −492.17516 | 41.0678 | SiO2 | 124.887 |
| | −242.55195 | .7000 | | 125.845 |
| L426 | 145.04614 | 37.2406 | SiO2 | 104.033 |
| | 406.88892 | .7008 | | 101.079 |
| L427 | 119.31280 | 31.5532 | SiO2 | 85.742 |
| | 249.59473 | 15.2917 | | 79.561 |
| L428 | 1411.93157 | 7.8700 | SiO2 | 74.994 |
| | 281.90273 | .7011 | | 66.830 |
| L429 | 143.95136 | 55.0835 | SiO2 | 61.517 |
| | 404.13980 | 15.0000 | | 32.177 |
| | infinity | .0001 | | 13.603 |
| | infinity | | | 13.603 |

Aspheric Constants:
Coefficients of the aspheric surface n: [where n is 27]

EX = 0.45321787 · 10²
C1 = 0.12027601 · 10⁻⁷
C2 = −0.16206398 · 10⁻¹¹
C3 = −0.41686011 · 10⁻¹³
C4 = 0.38440137 · 10⁻¹⁸
C5 = −0.15095918 · 10⁻²³
C6 = −0.84812561 · 10⁻²⁸

TABLE 4-continued

Coefficients of the aspheric surface n: [where n is 29]

EX = 0
C1 = −0.97452539 · $10^{-7}$
C2 = 0.32591078 · $10^{-11}$
C3 = 0.97426255 · $10^{-15}$
C4 = −0.846124 · $10^{-20}$
C5 = −0.12332031 · $10^{-23}$
C6 = 0.14443713 · $10^{-27}$
Coefficients of the aspheric surface n: [where n is 33]

EX = 0
C1 = 0.53144137 · $10^{-8}$
C2 = 0.21837618 · $10^{-12}$
C3 = 0.22801998 · $10^{-18}$
C4 = −0.87807963 · $10^{-21}$
C5 = 0.42592446 · $10^{-25}$
C6 = −0.85709164 · $10^{-30}$

TABLE 5

| j430a Lenses | Radii | Thicknesses | Glasses | ½ × Lens Diameter |
|---|---|---|---|---|
|  | infinity | 9.9853 |  | 61.549 |
| L501 | −265.92669 | 6.0000 | SiO2 | 61.549 |
|  | 857.92226 | 5.9813 |  | 65.916 |
| L502 | −2654.69270 | 14.4343 | SiO2 | 66.990 |
|  | −244.65590 | .7500 |  | 68.482 |
| L503 | 1038.40194 | 15.9955 | SiO2 | 71.883 |
|  | −333.95446 | .7500 |  | 72.680 |
| L504 | 359.47552 | 18.5128 | SiO2 | 74.430 |
|  | −532.57816 | .7500 |  | 74.416 |
| L505 | 213.38035 | 21.4562 | SiO2 | 72.985 |
|  | −1441.22634A | .7500 |  | 72.054 |
| L506 | 251.90156 | 6.6306 | SiO2 | 67.809 |
|  | 115.92184 | 28.4856 |  | 62.818 |
| L507 | −267.21040 | 6.0000 | SiO2 | 62.411 |
|  | 175.09702 | 23.2443 |  | 61.923 |
| L508 | −213.08557 | 6.0000 | SiO2 | 62.365 |
|  | 199.61141 | 30.8791 |  | 68.251 |
| L509 | −158.73046 | 6.0337 | SiO2 | 69.962 |
|  | −1108.92217A | 10.9048 |  | 81.119 |
| L510 | −314.37706 | 20.6413 | SiO2 | 84.163 |
|  | −169.59197 | .8014 |  | 88.902 |
| L511 | −3239.97175 | 43.6396 | SiO2 | 106.289 |
|  | −168.44726 | .7500 |  | 108.724 |
| L512 | 495.41910 | 48.8975 | SiO2 | 123.274 |
|  | −288.85737 | .7500 |  | 123.687 |
| L513 | 153.24868 | 48.7613 | SiO2 | 113.393 |
|  | 920.32139A | .7500 |  | 111.134 |
| L514 | 163.02502 | 15.7110 | SiO2 | 96.188 |
|  | 124.97610 | 44.2564 |  | 84.961 |
| L515 | −422.99493 | 6.0000 | SiO2 | 83.633 |
|  | 184.80620 | 31.4985 |  | 76.498 |
| L516 | −241.93022 | 6.0000 | SiO2 | 76.180 |
|  | 168.30899 | 51.3978 |  | 77.396 |
| L517 | −117.43130 | 8.5332 | SiO2 | 78.345 |
|  | 2476.47953 | 21.4666 |  | 98.469 |
| L518 | −311.36041 | 15.2223 | SiO2 | 101.209 |
|  | −221.58556 | .7500 |  | 105.324 |
| L519 | −934.37047 | 37.6781 | SiO2 | 122.239 |
|  | −216.75809 | .7500 |  | 125.425 |
| L520 | 3623.94786 | 39.6266 | SiO2 | 146.583 |
|  | −370.69232 | 1.1289 |  | 148.219 |
| L521 | 1209.82944 | 39.1543 | SiO2 | 157.194 |
|  | −613.71745 | .0000 |  | 157.954 |
|  | infinity | .7500 |  | 158.061 |
|  | stop | .0000 |  | 158.061 |
| L522 | 709.88915 | 36.2662 | SiO2 | 160.170 |
|  | −1035.75798 | .7500 |  | 160.137 |
| L523 | 313.44889 | 58.8000 | SiO2 | 155.263 |
|  | −1046.56219 | 28.7484 |  | 183.730 |
| L524 | −328.67790 | 15.0000 | SiO2 | 152.447 |
|  | −1283.32936 | 14.7084 |  | 148.826 |
| L525 | −540.24577 | 23.9839 | SiO2 | 148.336 |
|  | −305.19883 | .7610 |  | 148.189 |
| L526 | 152.28321 | 42.3546 | SiO2 | 114.055 |
|  | 384.50964 | .7531 |  | 109.924 |
| L527 | 124.88784 | 31.8554 | SiO2 | 91.106 |
|  | 279.80513 | 16.6796 |  | 86.038 |
| L528 | −28987.53974 | 7.4387 | SiO2 | 82.126 |
|  | 316.02224 | .8631 |  | 72.044 |
| L529 | 160.51161 | 54.1269 | SiO2 | 67.036 |
|  | 1341.25511 | 15.0000 |  | 37.374 |
|  | infinity | .0001 |  | 13.604 |
|  | infinity |  |  | 13.604 |

Aspheric Constants:
Coefficients of the aspheric surface n: [where n is 29]

EX = −0.27012883 · $10^{3}$
C1 = −0.48014089 · $10^{-7}$
C2 = 0.30075830 · $10^{-11}$
C3 = 0.34922943 · $10^{-15}$
C4 = 0.26946301 · $10^{-18}$
C5 = −0.58250631 · $10^{-23}$
C6 = 0.68991391 · $10^{-27}$
Coefficients of the aspheric surface n: [where n is 27]

EX = 0.41249481 · $10^{1}$
C1 = −0.38239182 · $10^{-8}$
C2 = −0.14976009 · $10^{-11}$
C3 = −0.25206193 · $10^{-18}$
C4 = −0.78282128 · $10^{-20}$
C5 = 0.13017800 · $10^{-23}$
C6 = −0.14205614 · $10^{-27}$
Coefficients of the aspheric surface n: [where n is 33]

EX = 0.26320110 · $10^{1}$
C1 = 0.27448935 · $10^{-8}$
C2 = −0.18100074 · $10^{-12}$
C3 = 0.58696756 · $10^{-17}$
C4 = −0.58955753 · $10^{-21}$
C5 = 0.16526308 · $10^{-22}$
C6 = −0.25708759 · $10^{-30}$
Coefficients of the aspheric surface n: [where n is 31]

EX = −095885859 · $10^{3}$
C1 = −0.42411179 · $10^{-8}$
C2 = 0.12306068 · $10^{-12}$
C3 = 0.69229786 · $10^{-17}$
C4 = 0.80135737 · $10^{-20}$
C5 = −0.14022540 · $10^{-23}$
C6 = 0.79827308 · $10^{-28}$

TABLE 6

| m767a Lenses | Radii | Thicknesses | Glasses | ½ × Lens Diameter |
|---|---|---|---|---|
|  | infinity | 5.9005 | N2 | 32.429 |
| L601 | −125.95821 | 3.6410 | CAF2 | 32.780 |
|  | 243.24465 | 5.2309 | He | 35.323 |
| L602 | 2472.77263 | 9.2265 | CAF2 | 35.825 |
|  | −132.46523 | .3958 | He | 37.854 |
| L603 | 544.60759 | 8.6087 | CAF2 | 40.080 |
|  | −188.98512 | .6007 | He | 40.516 |
| L604 | 180.26444 | 10.3984 | CAF2 | 41.764 |
|  | −394.70139 | .4244 | He | 41.743 |
| L605 | 101.06312 | 12.8236 | CAF2 | 40.955 |
|  | −691.58627A | .5111 | He | 40.455 |
| L606 | 135.75849 | 3.1245 | CAF2 | 37.653 |
|  | 57.03094 | 18.2395 | He | 34.284 |
| L607 | −268.26919 | 5.9149 | CAF2 | 33.871 |
|  | 116.53689 | 10.9654 | He | 33.188 |
| L608 | −142.54676 | 3.2195 | SiO2 | 33.372 |
|  | 100.09171 | 16.1921 | He | 35.380 |
| L609 | −83.03185 | 3.2311 | SiO2 | 36.264 |
|  | −453.73264A | 5.1711 | He | 41.718 |
| L610 | −167.92924 | 12.0560 | CAF2 | 43.453 |
|  | −93.29791 | .4204 | He | 47.010 |
| L611 | −1270.48545 | 24.2891 | CAF2 | 56.224 |
|  | −90.89540 | 1.1471 | He | 58.224 |

TABLE 6-continued

| | | | | |
|---|---|---|---|---|
| L612 | 256.81271 | 25.6379 | CAF2 | 66.498 |
| | −171.23687 | .3519 | He | 66.755 |
| L613 | 82.41217 | 26.8409 | CAF2 | 61.351 |
| | 529.17259A | .5132 | He | 60.098 |
| L614 | 81.87977 | 8.2278 | CAF2 | 50.462 |
| | 84.06535 | 22.9801 | He | 44.346 |
| L615 | −259.83061 | 3.3437 | SiO2 | 43.473 |
| | 124.29419 | 13.5357 | He | 40.286 |
| L616 | −197.29109 | 3.0000 | SiO2 | 39.809 |
| | 67.83707 | 24.6813 | He | 39.571 |
| L617 | −64.97274 | 4.6170 | SiO2 | 40.050 |
| | 1947.71288 | 9.3909 | He | 49.830 |
| L618 | −182.16003 | 7.8052 | CAF2 | 51.480 |
| | −118.82950 | .3753 | He | 53.449 |
| L619 | −633.93522 | 19.7976 | CAF2 | 83.119 |
| | −115.14087 | .3708 | He | 84.793 |
| L620 | 2647.04517 | 19.8039 | CAF2 | 75.458 |
| | −197.41705 | 2.7167 | He | 76.413 |
| L621 | 668.45083 | 30.1057 | CAF2 | 81.369 |
| | −322.45899 | .0001 | He | 82.659 |
| | infinity | .3948 | He | 82.583 |
| | stop | .0000 | | 82.583 |
| L622 | 395.84774 | 16.8754 | CAF2 | 83.488 |
| | −635.79877 | .3500 | He | 83.449 |
| L623 | 165.28880 | 28.1341 | CAF2 | 80.761 |
| | −598.21798 | 15.6657 | He | 80.133 |
| L624 | −175.54365 | 7.9803 | SiO2 | 79.485 |
| | −571.27581 | 9.7972 | He | 78.592 |
| L625 | −265.73712 | 11.6714 | CAF2 | 78.015 |
| | −156.05301 | .3500 | He | 78.036 |
| L626 | 79.45912 | 22.6348 | CAF2 | 60.151 |
| | 199.26460 | .3500 | He | 57.925 |
| L627 | 67.01872 | 16.8836 | CAF2 | 48.063 |
| | 140.01631 | 8.6050 | He | 45.305 |
| L628 | 2265.71693A | .0938 | SiO2 | 43.177 |
| | 167.06050 | 2.0915 | He | 38.352 |
| L629 | 10.24013 | 24.5664 | CAF2 | 34.878 |
| | 662.00758 | 9.4740 | N2 | 22.044 |
| | UNENDL | .0001 | N2 | 7.166 |
| | UNENDL | | | 7.166 |

Aspheric Constants:
Coefficients of the aspheric surface n: [where n is 29]

EX = −0.7980946 · $10^2$
C1 = −0.21353640 · $10^{-6}$
C2 = 0.56257 · $10^{10}$
C3 = −0.39122939 · $10^{-14}$
C4 = −0.24089788 · $10^{-18}$
C5 = 0.30268982 · $10^{-22}$
C6 = −0.1437923 · $10^{-25}$
Coefficients of the aspheric surface n: [where n is 27]

EX = 0.1860595 · $10^1$
C1 = −0.12449719 · $10^{-7}$
C2 = −0.39585 · $10^{-10}$
C3 = −0.10241741 · $10^{-14}$
C4 = −0.19831485 · $10^{-17}$
C5 = 0.11604236 · $10^{-20}$
C6 = −0.4689564 · $10^{-24}$
Coefficients of the aspheric surface n: [where n is 33]

EX = 0.1614147 · $10^1$
C1 = 0.14130608 · $10^{-7}$
C2 = −0.9747553 · $10^{-11}$
C3 = 0.20478884 · $10^{-13}$
C4 = −0.17732282 · $10^{-18}$
C5 = 0.29715991 · $10^{-22}$
C6 = −0.19032521 · $10^{-26}$
Coefficients of the aspheric surface n: [where n is 31]

EX = 0
C1 = −0.18139679 · $10^{-7}$
C2 = 0.26109059 · $10^{-11}$
C3 = 0.23340548 · $10^{-14}$
C4 = 0.29943791 · $10^{-17}$
C5 = −0.13595787 · $10^{-20}$
C6 = 0.21788235 · $10^{-24}$

What is claimed is:

1. A projection objective for microlithography having a lens arrangement comprising:
    a first lens group having positive power;
    a second lens group having negative power;
    a third lens group having positive power;
    a fourth lens group consisting of lenses with spherical surfaces, said fourth lens group having negative power;
    a fifth lens group having positive power; and
    a sixth lens group having positive power;
    wherein a lens at the end of said second lens group, or a lens at the beginning of said third lens group, has an aspheric surface.

2. The projection objective according to claim 1, wherein said lens at the end of said second lens group is the last lens of the second lens group.

3. The projection objective according to claim 1, wherein said lens at the beginning of said third lens group is the first lens of said third lens.

4. The projection objective according to claim 1, wherein said lens arrangement has only one lens having an aspheric surface.

5. The projection objective according to claim 1, wherein said sixth lens group has a first lens having an aspheric surface.

6. The projection objective according to claim 1, wherein a last lens of said third lens group has an aspheric surface.

7. The projection objective according to claim 1, wherein said lens arrangement does not exceed a maximum lens diameter of 280 mm.

8. The projection objective according to claim 7, wherein said lens arrangement does not exceed a maximum lens diameter of 250 mm.

9. The projection objective according to claim 1, having an objective side and an image side, wherein said lens arrangement has on said image side a numerical aperture of at least 0.75.

10. The projection objective according to claim 9, wherein said lens arrangement has on said image side a numerical aperture of 0.8.

11. The projection objective according to claim 1, wherein said lens arrangement comprises at least two different materials.

12. The projection objective according to claim 11, wherein said different materials comprise quartz glass and a fluoride or two fluorides.

13. The projection objective according to claim 1, wherein said lens arrangement comprises a positive lens comprised of $CaF_2$, followed by a negative lens of quartz glass, for formation of an achromat.

14. The projection objective according to claim 1, wherein said sixth lens group comprises a lens of $CaF_2$.

15. The projection objective for microlithography according to claim 1, wherein the diameter said lens having an aspheric surface is smaller than 90% of the maximum diameter of said lens arrangement.

16. The projection objective according to claim 15, wherein the diameter of said lens having an aspheric surface is smaller than 80% of the maximum diameter of said lens arrangement.

17. A projection exposure device for microlithography, comprising a projection objective according to claim 1.

18. The projection objective comprising a lens arrangement according to claim 1, wherein said lens arrangement has a high numerical aperture on an objective output side, and all lenses of said lens arrangement have sine values of all angles of incidence of radiation striking a respective lens that are always smaller than the numerical aperture of said lens arrangement.

19. The projection objective according to claim 18, wherein said numerical aperture is in the region of 0.85.

20. The projection objective comprising a lens arrangement according to claim 1, wherein the maximum diameter of lenses of said third lens group is at least 10% smaller than the maximum diameter of lenses of said fifth lens group.

21. The projection objective comprising a lens arrangement according to claim 1, wherein at least one aspheric lens surface is acted on with an angle loading of at least sin i=0.75.

22. A process for the production of microstructured components, comprising:
    exposing a substrate provided with a photosensitive layer with ultraviolet light by means of a mask and a projection exposure device with a lens arrangement according to claim 1, and,
    if necessary after development of said photosensitive layer, structuring said substrate corresponding to a pattern contained on said mask.

23. A projection objective having a lens arrangement having a lens arrangement having at least a first waist of a pencil of rays, wherein said lens arrangement comprises at least one of the following:
    a lens having an aspheric surface arranged before said first waist,
    a lens having an aspheric surface arranged after said first waist, and
    lenses having aspheric surfaces arranged before and after said first waist,
    wherein at least two spherical lenses are arranged between said lenses having aspheric surfaces,
    wherein a lens having an aspheric surface is arranged in said second lens group before said waist.

24. The projection objective according to claim 23, wherein said lens arrangement has a first lens group having positive power, a second lens group having negative power, a third lens group having negative power, a fourth lens group consisting of lenses with spherical surfaces, said fourth lens group having negative power, and a fifth and sixth lens group respectively having positive power, wherein said first lens group has a lens having an aspheric surface.

25. The projection objective according to claim 24, wherein said third lens group has a lens having an aspheric surface.

26. The projection objective according to claim 23, further comprising an aperture stop wherein at least a last two positive lenses before said aperture stop are comprised of $CaF_2$.

27. A projection exposure device for microlithography, comprising an excimer laser light source emitting radiation of wavelength shorter than 250 mm, and a projection objective according to claim 26.

28. A refractive microlithographic projection objective, having a lens arrangement comprising at least one lens with an aspheric lens surface, wherein all aspheric lens surfaces have a vertex radius (R) of at least 350–1,000 mm.

29. A refractive microlithographic projection objective, having a lens arrangement comprising at least one lens with an aspheric lens surface, wherein all aspheric lens surfaces have a vertex radius (R) is greater than 1,000 mm.

30. A projection objective for microlithography having a lens arrangement comprising:
    a first lens group having positive power;
    a second lens group having negative power;
    a third lens group having positive power;
    a fourth lens group having negative power;
    a fifth lens group having positive power; and
    a sixth lens group having positive power;
    wherein a lens at the end of said second lens group, or a lens at the beginning of said third lens group, has an aspheric surface; and
    wherein said lens at the end of said second lens group is the last lens of the second lens group.

31. The projection objective according to claim 30, wherein said lens at the beginning of said third lens group is the first lens of said third group.

32. The projection objective according to claim 30, wherein said lens arrangement has only one lens having as aspheric surface.

33. A projection objective for microlithography having a lens arrangement comprising:
    a first lens group having positive powers;
    a second lens group having negative power;
    a third lens group having positive power;
    a fourth lens group having negative power;
    a fifth lens group having positive power; and
    a sixth lens group having positive power;
    wherein a lens at the end of said second lens group, or a lens at the beginning of said third lens group, has an aspheric surface, and
    wherein a last lens of said third lens group has an aspheric surface.

34. A projection objective for microlithography having a lens arrangement comprising:
    a first lens group having positive power;
    a second lens group having negative power;
    a third lens group having positive power;
    a fourth lens group having negative power;
    a fifth lens group having positive power; and
    a sixth lens group having positive power;
    wherein a lens at the end of said second lens group, or a lens at the beginning of said third lens group, has an aspheric surface, and
    wherein said lens arrangement does not exceed a maximum lens diameter of 280 mm.

35. The projection objective according to claim 34, wherein said lens arrangement does not exceed a maximum lens diameter of 250 mm.

36. A projection objective for microlithography having a lens arrangement comprising:
    a first lens group having positive power;
    a second lens group having negative power;
    a third lens group having positive power;
    a fourth lens group having negative power;
    a fifth lens group having positive power; and
    a sixth lens group having positive power;
    wherein a lens at the end of said second lens group, or a lens at the beginning of said third lens group, has an aspheric surface, and
    the projection objective having an object side and an image side, wherein said lens arrangement has on said image side a numerical aperture of 0.8.

37. A projection objective for microlithography having a lens arrangement comprising:
   a first lens group having positive power;
   a second lens group having negative power;
   a third lens group having positive power;
   a fourth lens group having negative power;
   a fifth lens group having positive power; and
   a sixth lens group having positive power;
   wherein a lens at the end of said second lens group, or a lens at the beginning of said third lens group, has an aspheric surface, and
   wherein said sixth lens group comprises a lens of $CaF_2$.

38. The projection objective according to claim 37, wherein said numerical aperture is in the region of 0.85.

39. A projection objective for microlithography having a lens arrangement comprising:
   a first lens group having positive power;
   a second lens group having negative power;
   a third lens group having positive power;
   a fourth lens group having negative power;
   a fifth lens group having positive power; and
   a sixth lens group having positive power;
   wherein a lens at the end of said second lens group, or a lens at the beginning of said third lens group, has an aspheric surface, and
   wherein the maximum diameter of lenses of said third lens group is at least 10% smaller than the maximum diameter of lenses of said fifth lens group.

40. A projection objective for microlithography having a lens arrangement comprising:
   a first lens group having positive power;
   a second lens group having negative power;
   a third lens group having positive power;
   a fourth lens group having negative power;
   a fifth lens group having positive power; and
   a sixth lens group having positive power;
   wherein a lens at the end of said second lens group, or a lens at the beginning of said third lens group, has an aspheric surface, and
   wherein at least one aspheric lens surface is acted on with an angle loading of at least sin i=0.75.

* * * * *

UNITED STATES PATENT AND TRADEMARK OFFICE
CERTIFICATE OF CORRECTION

PATENT NO. : 6,801,364 B2
DATED : October 5, 2004
INVENTOR(S) : Karl-Heinz Schuster It is certified that error appears in the above-identified patent and that said Letters Patent is hereby corrected as shown below:

Column 17,
Line 25, "having a lens arrangement" should be deleted.

Signed and Sealed this

Seventh Day of June, 2005

JON W. DUDAS
*Director of the United States Patent and Trademark Office*